United States Patent
Takata

(10) Patent No.: US 7,120,214 B2
(45) Date of Patent: Oct. 10, 2006

(54) SYNCHRONOUS SIGNAL TRANSFER AND PROCESSING DEVICE

(75) Inventor: Hidehiro Takata, Hyogo (JP)

(73) Assignee: Renesas Technology Corp., Tokyo (JP)

(*) Notice: Subject to any disclaimer, the term of this patent is extended or adjusted under 35 U.S.C. 154(b) by 742 days.

(21) Appl. No.: 10/214,598

(22) Filed: Aug. 9, 2002

(65) Prior Publication Data

US 2003/0030472 A1 Feb. 13, 2003

(30) Foreign Application Priority Data

Aug. 10, 2001 (JP) ............................. 2001-243777

(51) Int. Cl.
*H04L 7/00* (2006.01)
*H04L 27/00* (2006.01)
(52) U.S. Cl. ...................................... 375/354; 375/259
(58) Field of Classification Search ................ 375/371, 375/373, 354, 356, 316, 259; 327/141, 144
See application file for complete search history.

(56) References Cited

U.S. PATENT DOCUMENTS

| | | | |
|---|---|---|---|
| 3,646,419 A | * | 2/1972 | Holy et al. ................... 318/603 |
| 4,153,817 A | * | 5/1979 | D'Ortenzio ................... 370/268 |
| 4,819,008 A | * | 4/1989 | Nagato et al. ............... 347/184 |
| 5,987,081 A | * | 11/1999 | Csoppenszky et al. ....... 375/354 |
| 6,181,757 B1 | * | 1/2001 | Neumann et al. ........... 375/375 |
| 6,393,082 B1 | * | 5/2002 | Nakamura ................... 375/368 |
| 2001/0048459 A1 | * | 12/2001 | Sakai et al. ................. 347/233 |

FOREIGN PATENT DOCUMENTS

| | | |
|---|---|---|
| JP | 3-171498 | 7/1991 |
| JP | 10-40692 | 2/1998 |

* cited by examiner

*Primary Examiner*—Tesfaldet Bocure
(74) *Attorney, Agent, or Firm*—McDermott Will & Emery LLP

(57) ABSTRACT

A transfer circuit includes a plurality of cascaded latch circuits. Two consecutive latch circuits in the transfer circuit complementarily enter a latching state and a transparent state in response to the applied clock signal, and data/a signal is transferred through the transfer circuit in response to the clock signal. A clock control circuit is provided for controlling an operation of each of the latch circuits. The clock control circuit detects that the latch circuit in a next stage of the corresponding latch circuit enters the latching state to permits transfer of the signal/data of the corresponding latch circuit to the subsequent stage in accordance with the corresponding clock signal. It is possible to prevent the data/signal from being transferred while the latch circuit at the next stage is in the transparent state to accurately transfer the data/signal. A clock synchronous data transfer and processing device reliably preventing racing is implemented with a simple circuit configuration.

20 Claims, 18 Drawing Sheets

SYNCHRONOUS SIGNAL TRANSFER AND PROCESSING DEVICE

BACKGROUND OF THE INVENTION

1. Field of the Invention

The present invention relates to a synchronous signal transfer and processing device for transferring a signal/data in accordance with a clock signal. More specifically, the present invention relates to a configuration for avoiding racing on the signal transfer path of the synchronous type signal transfer and processing device.

2. Description of the Background Art

A clock synchronous processing scheme of transferring and processing a signal synchronously with a clock signal is normally employed for high speed signal/data processing. According to this synchronous processing scheme, data/signal is transferred and processed by controlling the operation state of a latch circuit or a flip-flop circuit for holding the data/signal in synchronization with a clock signal.

The synchronous processing scheme for transferring and processing a signal synchronously with a clock signal allows a signal/data to be processed in a pipeline fashion, achieving high-speed processing. In addition, since signal/data (to be simply referred to as "data" hereinafter) processing timing and data transfer timing are determined by a clock signal, a margin for processing start timing can be decreased and high-speed data processing can be implemented. Further, since a data processing cycle is determined by a clock signal cycle, high-speed processing is achieved.

According to the above-stated clock synchronous processing scheme, clock signals as same in timing and less different in phase as possible should be transferred to many latch circuits or flip-flop circuits, in order to allow these latch/flip-flop circuits to operate at the same timing. For that reason, various clock distribution schemes are employed to transmit a main clock signal from a clock input buffer or the like with a clock skew as small as possible. These clock distribution schemes include a clock tree scheme for transmitting clock signals to the respective latch or flip-flop circuits through clock branch paths arranged in a tree-like form, a clock mesh scheme for transmitting a main clock signal through clock distribution paths arranged in a meshed form, a fishbone scheme for providing a branch path on a main clock transmit line extending almost linearly, driving this branch path by a clock driver and transferring clock signals to the respective latch or flip-flop circuits and the like.

FIG. 28 shows an example of the configuration of a conventional synchronous data processing and transfer device. In FIG. 28, the clock tree scheme is employed as the clock distribution scheme by way of example.

In FIG. 28, a clock distribution system includes a clock driver DR0 for buffering a main clock signal MCLK, and clock drivers (repeaters) DR1a to DR1c, arranged at predetermined intervals on a clock distribution path LP0 coupled to a clock distribution node ND0, for buffering clock signals on clock distribution path LP0, respectively. Clock drivers DR1a to DR1c transmit the clock signals to clock branch paths LP1a to LP1c coupled to clock distribution nodes ND1a to ND1c, respectively.

Parasitic capacitance Ca and parasitic resistance Ra exist on clock distribution path LP0. In addition, parasitic resistance Rb and parasitic capacitance Cb due to interconnection line capacitance and resistance also exist on clock transmission lines driven by clock drivers DR1a to DR1c, respectively.

In these clock distribution routes, main clock signal MCLK from clock driver DR0 is transmitted through clock distribution paths arranged in a tree-like form. The distribution paths arranged in a tree-like form are arranged symmetrically with respect to clock driver DR0 transmitting main clock signal MCLK so that the paths transmitting the clock signals are made equal in delay time. On each respective branch path of this clock tree, a signal propagation path between a clock terminating node of the final stage and a main cock signal input node is set to have as equal interconnection line delay as possible to make clock skews on respective clock terminating nodes as small as possible.

Signal processing related circuitry includes latch circuits LTa to LTc arranged corresponding to clock drivers DR1a to DR1c, respectively. Latch circuits LTa and LTc have the same configuration and operate in a common phase. Latch circuit LTb operates in a reversed phase to latch circuits LTa and LTc. Specifically, each of latch circuits LTa and LTc includes an inverter IVa that receives clock signal CLK from the corresponding clock driver, a transfer gate TXa that is rendered conductive, when clock signal CLK from the corresponding clock driver is at H level, to pass a signal received from the circuit in a preceding stage, an inverter IVb that receives the signal transmitted through transfer gate TXa, an inverter IVc that inverts the output signal of inverter IVb and transmits the inverted output signal to the circuit at the next stage, and a tri-state inverter TVa that is made active, when the output signal of inverter IVa is at H level, to invert the output signal of inverter IVb for transmission to the input node of inverter IVb.

Latch circuit LTb includes an inverter IV1 which receives clock signal CLK from corresponding clock driver DR1b, a transfer gate TXb which is made conductive, when the output signal of inverter IV1 is at H level, to pass a signal transmitted from the circuit in a preceding stage, an inverter IV2 which receives the signal transmitted through transfer gate TXb, an inverter IV3 which inverts the output signal of inverter IV2 and transmits the inverted output signal to the circuit at the next stage, and a tri-state inverter TV1 which is made active, when clock signal CLK from corresponding clock driver DR1b is at H level, to invert the output signal of inverter IV2 for transmission to the input node of inverter IV2.

A delay circuit DLa is interposed between latch circuits LTa and LTb. A delay circuit DLb is interposed between latch circuits LTb and LTc. These delay circuits DLa and DLb are provided for preventing data to be latched from being rewritten by an applied signal if latch circuits LTa to LTc simultaneously turn into a transparent state due to a clock skew.

As shown in FIG. 28, on the clock distribution path, clock drivers DR1a to DR1c are arranged corresponding to latch circuits LTa to LTc, respectively so that clock transmission paths from main clock signal MCLK to respective latch circuits LTa to LTc have same a signal transmission delay as possible. It is intended to make the operation timing of each of latch circuits LTa to LTc as same as possible to achieve synchronous data transfer.

In this arrangement, when transfer gates TXa turn conductive in respective latch circuits LTa and LTc and latch circuits LTa and LTc turn into a transparent state of passing an applied signal, transfer gate TXb of latch circuit LTb is in a nonconductive state, and latch circuit LTb is in a latching state. Therefore, the output data of latch circuit LTa is not captured by latch circuit LTb and latch circuit LTc transmits latch data of latch circuit LTb to the circuit at the next stage. On the other hand, when transfer gates TXa of respective latch circuits LTa and LTc are nonconductive and latch circuits LTa and LTc are in a latching state, transfer gate TXb of latch circuit LTb is in a conductive state and latch circuit LTb is in a transparent state. Therefore, latch circuit LTb transmits the latched data of latch circuit LTa to latch circuit LTc at the next stage.

As shown in FIG. 28, by alternately setting latch circuits LTa to LTc in the transparent state and latching state, it is possible to sequentially transfer data from latch circuits LTa to LTc synchronously with clock signal CLK.

However, line parasitic resistance and line parasitic capacitance exist on each of clock distribution paths LP0 to LP1c shown in FIG. 28. If the lengths of the clock transmission paths are equal for all latch circuits LTa to LTc, the clock transmission paths for latch circuits LTa to LTc have the same clock propagation delay and a clock skew is hardly caused. However, the clock distribution paths differ in interconnection length, and therefore in parasitic resistance and parasitic capacitance, according to the arranged positions of latch circuits LTa to LTc. Thus, a clock skew occurs in clock signals CLK transmitted from clock drivers DR1a to DR1c to respective latch circuits LTa to LTc.

FIG. 29 is a timing chart representing the operations of the circuit device shown in FIG. 28 when a clock skew occurs. In FIG. 29, a clock skew occurs in clock signal CLK arriving at latch circuits LTa to LTc due to the difference in interconnection line delay. FIG. 29 shows an example of a state in which clock signal CLK arrives at the node (clock input node) NA of transfer gate TXa of latch circuit LTa earliest and arrives at the control node NB of transfer gate TXb of latch circuit LTc latest.

If a clock skew occurs as shown in FIG. 29, a period, in which both the control signals at control nodes (clock input nodes) NA and NB of latch circuits LTa and LTb become H level, is caused. If latch circuit LTa takes in an applied signal synchronously with the rise of clock signal CLK for transference to the circuit at the next stage, when transfer time for transferring data from latch circuit LTa to latch circuit LTb is shorter than an overlap period in which both the control signals at clock input nodes NA and NB are at H level, data to be latched by latch circuit LTb is rewritten by the data taken in by latch circuit LTa, and an erroneous rewriting occurs. This malfunction is generated due to the competition between the clock signal and the data, and therefore, it is referred to as "racing".

To prevent such racing, delay circuits DLa and DLb are arranged as shown in FIG. 28. By arranging delay circuit DLa, time required for transmitting data DA captured by latch circuit LTa to the input of latch circuit LTb is made longer than an overlap period TS as shown in FIG. 30. In this arrangement, even if latch circuits LTa and LTb both turn into a transparent state, the latched data of latch circuit LTb is not rewritten by new data DA, making it possible to avoid racing.

However, if delay circuits DLa and DLb are arranged on the data transmission path, the number of components of logical gates disadvantageously increases and a layout area and power dissipation disadvantageously increases.

Further, the following procedure is required in an actual analysis of a circuit operation. Timing verification is performed for each signal transmission path. The clock timing of each latch circuit is adjusted based on the result of the timing verification. Therefore, it is necessary to interpose delay circuits, taking into account an optimum delay amount which do not influence the setup times of the latch circuits.

Specifically, as shown in FIG. 31, if data DA is transferred, valid data is transferred and latched by, for example, latch circuit LTa after clock signal CLK rises and then delay time TD of the delay circuit in the preceding stage passes. It is necessary to turn the latched data of latch circuit LTa into a definite state before clock signal CLK rises and latch circuit LTa enters a latching state. Time period in which this latched data is held in a definite state before the latch circuit enters a latching state is referred to as "setup time Tsu".

Accordingly, if the cycle time of clock signal CLK is determined, when delay time TD becomes longer, setup time Tsu becomes shorter. In this case, there is caused a probability that the data in the definite state cannot be latched and unascertained data is transferred to the latch circuit at the next stage, causing a malfunction. Therefore, if delay time TD is increased, the cycle time of clock signal CLK cannot be shortened, making it impossible to achieve high-speed operation.

A configuration aiming to prevent the above-stated racing issue and to decrease the number of components on signal transmission paths is disclosed in, for example, Japanese Patent Laid-Open No. 10-40692(1998).

FIG. 32 is a schematic block diagram showing a structure of a conventional synchronous transfer and processing device. In FIG. 32, cascaded flip-flops FFa to FFc of three stages are shown. Gate circuits AGa to AGc generating control signals are arranged corresponding to flip-flops FFa to FFc, respectively. Each of gate circuits AGa to AGc receives clock signal CLK and a control signal for the flip-flop at the next stage. Specifically, gate circuit AGa receives clock signal CLK and the output signal of gate circuit AGb. Gate circuit AGb receives clock signal CLK and the output signal of gate circuit AGc. Gate circuit AGc receives clock signal CLK and the output signal of a gate circuit provided corresponding to a flip-flop at the next stage which is not shown. The clock signal may be transferred to respective flip-flops FFa to FFc through clock distribution circuitry or may be transferred from a common clock driver.

If a control signal applied to a clock input T from each of corresponding gate circuits AGa to AGc turns H level, each of flip-flops FFa to FFc enters into a latching state and outputs data taken in when the control signal is at L level. That is, if the control signal applied from each of corresponding gate circuits AGa to AGc is at L level, each of flip-flops FFa to FFc takes in data applied to an input D thereof and outputs the taken in data from an output Q.

FIG. 33 shows an example of the configuration of each of flip-flops FFa to FFc shown in FIG. 32. Since flip-flops FFa to FFc have the same configuration, the configuration of a flip-flop FF is representatively shown in FIG. 33. In FIG. 33, flip-flop FF includes an inverter IV 10 which inverts a control signal applied to clock input T, a transfer gate TX10 which is rendered conductive, when the output signal of inverter IV10 is at H level, to pass a signal applied to an input node D, an inverter IV11 which inverts the signal applied through transfer gate TX10, an inverter IV12 which inverts the output signal of inverter IV11, a tri-state inverter buffer IV 13 which is made active, when the signal applied to clock input node T is at the H level, to invert the output signal of inverter IV 11 for transmission to the input of inverter IV11, a transfer gate TX11 which is rendered conductive, when the control signal applied to clock input node T is at H level, to transmit the output signal of inverter IV12, an inverter IV14 which receives the signal applied through transfer gate TX11, an inverter IV 15 which inverts the output signal of inverter IV 14 for transmission to output node Q, and a tri-state inverter buffer IV 16 which is made active, when the output signal of inverter IV10 is at H level, to invert the output signal of inverter IV14 for transmission to the input of inverter IV14.

Flip-flop FF shown in FIG. 33 consists of latch circuits cascaded in two stages. These latch circuits are alternately set in a latching state and in a transparent state. That is, when the control signal applied to clock input node T is at L level, transfer gate TX10 is rendered conductive, transfer gate TX11 turns nonconductive, and the data applied to input node T is inverted by inverter IV11 and transmitted to inverter IV12. In this state, tri-state inverter buffer IV13 is in an inactive state and in output high-impedance state. Therefore, the output signals of inverters IV11 and IV12 change according to the data applied to input node D. On the other hand, transfer gate TX11 is nonconductive and the data of output node Q does not change.

When the control signal applied to clock input node T attains H level, transfer gate TX10 turns nonconductive, transfer gate TX11 turns conductive and the signal taken in when the control signal is at L level is transmitted to output node Q through inverters IV14 and IV15. In this state, tri-state inverter buffer IV13 is also activated and the previously taken in data is latched by inverter IV11 and tri-state inverter buffer IV13. Therefore, flip-flop FF takes in the data applied to input node D when the control signal applied to clock input node T is at L level, latches the taken in data and outputs the captured data from output node Q when the control signal attains H level.

FIG. 34 is a timing chart representing the operations of the circuit device shown in FIG. 32. In FIG. 34, operations in the case where clock signal CLK applied to flip-flop FFc has the longest delay and clock signal CLK applied to flip-flop FFa has the shortest delay are shown for simplification of description.

When clock signal CLK is at L level, each of gate circuits AGa to AGc outputs a signal at an L level irrespectively of the state of the flip-flop at the next stage. When the control signal applied to clock input node T is at L level, each of flip-flops FFa to FFc takes in data applied to input node D, but the signal at output node Q does not change. When clock signal CLK applied to gate circuit AGc attains H level, the output data of flip-flop FFc changes, transfer gate TX10 connected to input node D of flip-flop FFc turns nonconductive and flip-flop FFc enters a latching state.

When the output signal of gate circuit AGc attains H level, since clock signal CLK is at H level, gate circuit AGb rises the control signal applied to clock input node T of flip-flop FFb to H level. Accordingly, the output data of flip-flop FFb changes and flip-flop FFb enters a latching state.

When the control signal outputted from gate circuit AGb rises to H level, the control signal outputted from gate circuit AGa attains H level, the output signal of flip-flop FFa changes, and flip-flop FFa enters a latching state.

In the circuit device shown in FIG. 32, therefore, after the flip-flop at the next stage enters a latching state, the output data of the flip-flop in the preceding stage changes, thereby preventing erroneous latching of data by the flip-flop at the next stage. That is, as shown in FIG. 32, new data is outputted to the flip-flop at the next stage after this flip-flop turns into a latching state, thereby preventing data from piercing through the flip-flops due to a clock skew as shown in FIG. 35. FIG. 35 shows operations in a case where clock signal CLK applied to flip-flop FFa leads in phase the clock signal CLK applied to flip-flop FFb. As shown in FIG. 35, if a clock skew occurs, when flip-flop FFa turns into a latching state in response to the rise of clock signal CLK, flip-flop FFb is in a signal taking-in state and takes in the output data of flip-flop FFa. Therefore, when clock signal CLK to flip-flop FFb rises, flip-flop FFb turns into a latching state and outputs the output data of flip-flop FFa within the current clock cycle of clock signal CLK. Therefore, data to be transferred after one clock cycle in a correct operation is outputted from flip-flops FFa and FFb in the same cycle, and a malfunction occurs.

It is intended to avoid such data piercing, using gate circuits AGa to AGc shown in FIG. 32.

However, where with the gate circuits shown in FIG. 32, the flip-flop at the next stage enters a latching state and then the corresponding latch circuit enters the latching state in accordance with clock signal CLK to change the output data of the flip-flop, the transmission path of this control signal sequentially propagates the control signal through a series of flip-flops.

It is now considered a data transmission path comprised of flip-flops FF0 to FFn as shown in FIG. 36. Gate circuits AG0 to AGn-1 are provided corresponding to flip-flops FF0 to FFn-1, respectively. Each of gate circuits AG0 to AGn-1 receives corresponding clock signal CLK and a control signal for the flip-flop at the next stage. Flip-flop FFn at the final stage is supplied only with clock signal CLK.

Consider a case where clock signal CLK applied to flip-flop FFn has the longest delay on the data transmission path shown in FIG. 36. In this case, after flip-flop FFn enters a latching state, flip-flop FFn-1 at a preceding stage of flip-flop FFn turns into a latching state and outputs an output signal. Accordingly, in order to set flip-flop FF0 in the first stage in a latching state and to change the output signal of flip-flop FF0, the transmission delays of gate circuits AG0 to AGn-1 are added to the delay time of clock signal CLK. As shown in FIG. 37, therefore, when clock signal CLK applied to flip-flop FFn in the final stage rises to H level after elapse of time Ti since clock signal applied to flip-flop FF0 in the first stage rises to H level, the output signal outputted from gate circuit GA0 attains H level after elapse of signal transmission delay time T2 through gate circuits AG0 to AGn-1. Consequently, the latch circuit in the output stage of flip-flop FF0 in the first stage is required to take in the latch data of the latch circuit in the input stage and transfers the taken-in data to flip-flop FF1 at the next stage within time period T3. However, the setup time of the latch circuit in the output stage of the flip-flop FF0 cannot be sufficiently ensured, with the result that data in an indefinite state may be outputted. If a logical processing circuit is interposed between flip-flops FF0 and FF1, in particular, the processing time of this logical processing circuit cannot be sufficiently secured, with the result that high-speed processing cannot be achieved.

Moreover, the latch time of each of flip-flops cannot be sufficiently secured, leading to a problem that the flip-flops may malfunction.

SUMMARY OF THE INVENTION

It is an object of the present invention to provide a synchronous data transfer and processing device capable of insuring a clock cycle having a sufficient time width for each transfer gate to reliably transfer data.

It is another object of the present invention to provide a synchronous data transfer and processing device capable of providing sufficient processing time to a logical circuit even if the logical circuit is interposed between the flip-flops.

It is still another object of the present invention to provide a synchronous data transfer and processing device capable of reliably avoiding racing without a delay circuit.

It is yet another object of the present invention to provide a synchronous data transfer and processing device capable of easily adjusting timing in timing verification.

A synchronous data transfer and processing device according to a first aspect of the present invention includes at least one data transfer path including a plurality of cascaded latch circuits each entering a transparent state for passing an applied signal through an output node and a latching state for holding the signal at the output node irrespectively of a change of a signal at a signal input node in accordance with a clock signal applied to the clock input node. Any two consecutive latch circuits in the plurality of latch circuits are configured such that when one is in the latching state, the other is in the transparent state.

The synchronous data transfer and processing device according to the first aspect of the present invention further includes control circuitry for generating a control signal for controlling a state of each of the plurality of latch circuits and transmitting the generated control signal to the respective latch circuits. The control circuitry includes a plurality of clock control circuits, arranged corresponding to the respective latch circuits, for applying the control signals to the clock input nodes of corresponding latch circuits in accordance with clock signals transmitted to the corresponding latch circuits and the signals at the clock input nodes of the latch circuits in subsequent stages.

A synchronous data transfer and processing device according to a second aspect of the present invention includes at least one signal transfer path including: a plurality of flip-flops each having a first latch circuit and a second latch circuit complementarily entering a latching state and a transparent state; and a logical circuit interposed at a selected position on the signal transmission path, performing a predetermined processing on an applied signal, and outputting a resultant signal, and transfer control circuitry controlling a signal transfer operation of each of the plurality of flip-flops. The transfer control circuitry includes a plurality of flip-flop control circuits, arranged corresponding to the respective flip-flops, each for generating a control signal for a corresponding flip-flop in accordance with a clock signal transmitted to the corresponding flip-flop and the control signal to the flip-flop at a next stage. Each of the flip-flop control circuits includes a flip-flop control circuit for generating the control signal for the corresponding flip-flop in accordance with the transmitted clock signal when the control signal to the flip-flop at the next stage indicates that the flip-flop at the next stage enters the latching state, and a logical stage control circuit, arranged corresponding to the flip-flop at a preceding stage of the corresponding logical circuit, for simulating that the flip-flop arranged at the next stage of the corresponding logical circuit is in the latching state and generating the control signal to the flip-flop in the preceding stage of the corresponding logical circuit in accordance with the clock signal.

In the latch circuits complementarily entering the transparent state and latching state, the state of each latch circuit is controlled in accordance with the control signal to the latch circuit at the next stage and the corresponding clock signal. Thus, after the latch circuit at the next stage turns into the latching state, the corresponding latch circuit can be set in a transparent state. As a result, it is possible to prevent a plurality of latch circuits from simultaneously entering the transparent state and thus to prevent racing. By using the control signal for the latch circuit at the next stage, in particular, a state control for a latch circuit is made according to the state of the latch circuit at the next stage. Thus, the control signal propagation delay over the entire latch circuit string can be sufficiently shortened due to no need of sequentially transmitting the control signal, to secure a sufficient clock cycle for each latch circuit.

Furthermore, with the configuration of employing a string of flip-flops and interposing the logical circuit between flip-flops, control on the state of the flip-flop in the preceding stage of the logical circuit is performed simulating that the flip-flop at the next stage is in a latching state. It is possible to shorten a propagation path for this control signal and to sufficiently secure an effective clock cycle width for each flip-flop, accordingly.

Moreover, since a delay circuit is not employed to prevent the racing between the transfer gates of these latch circuits and of the flip-flops, it suffices to simply adjust the timing of the clock signal in timing verification, facilitating timing adjustment.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
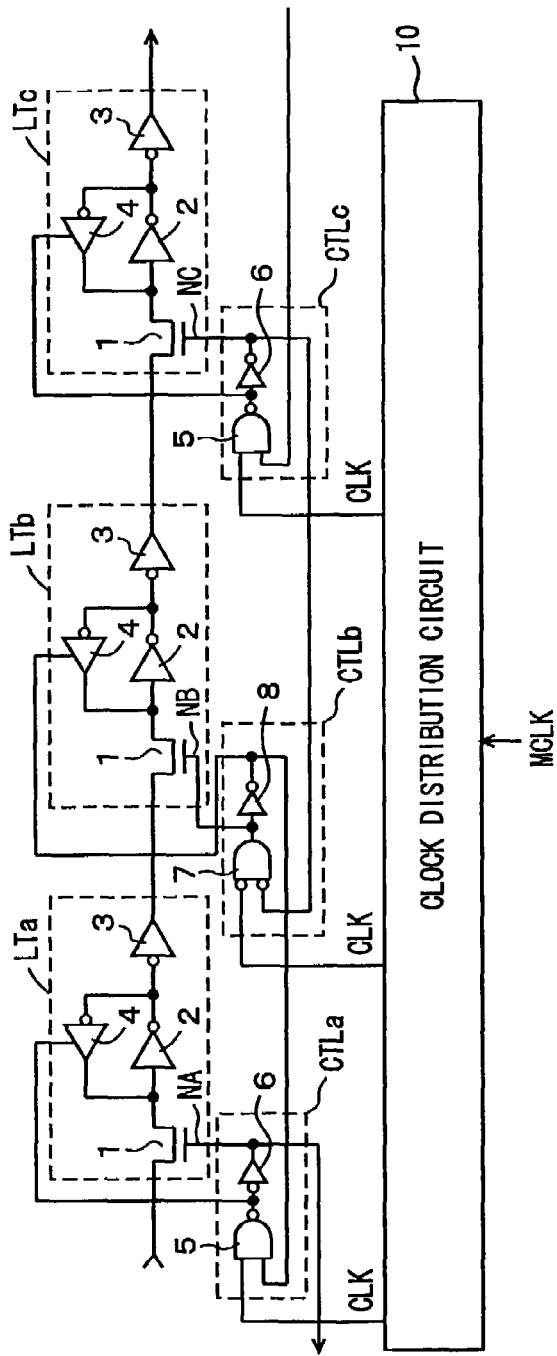
FIG. 1A is a block diagram of a synchronous data transfer and processing device according to a first embodiment of the present invention.

FIG. 1A is a schematic diagram showing a construction of a synchronous data transfer and processing device according to the first embodiment of the present invention. In FIG. 1A, latch circuits LTa to LTc cascaded in three stages are representatively shown. Clock control circuits CTLa to CTLc which generates control signals controlling the states (the latching state and the transparent state) of the corresponding latch circuits in accordance with clock signals CLK from a clock distribution circuit 10 and control signals for the latch circuits at the next stages, respectively are provided corresponding to latch circuits LTa to LTc, respectively.

Latch circuits LTa to LTc have the same configuration, and each includes a transfer gate 1 which selectively turns conductive in response to a control signal from corresponding clock control circuit CTLa, CTLb or CTLc, an inverter 2 which inverts data transmitted through transfer gate 1, an inverter 3 which inverts the output data of inverter 2 and transfers the inverted output data to the latch circuit at the next stage, and a tri-state inverter buffer 4 which inverts the output data of inverter 2 and transmits the inverted output data to the input section of inverter 2 when active. This tri-state inverter buffer 4 enters an output high-impedance state when inactive. Transfer gate 1 is formed of an N-channel MOS transistor (insulated gate type field effect transistor). When transfer gate 1 is conductive, tri-state inverter buffer 4 is in an output high-impedance state. When transfer gate 1 is nonconductive, tri-state inverter buffer 4 is active, inverts the output signal of inverter 2 and transmits the inverted output signal to the input of inverter 2 and latches data taken in when transfer gate 1 is conductive.

Clock control circuits CTLa and CTLc have the same configuration. Clock control circuit CTLb generates a control signal changing complementarily to the control signals from clock control circuits CTLa and CTLc.

Each of clock control circuits CTLa and CTLc includes an NAND gate 5 which receives clock signal CLK transmitted from clock distribution circuit 10 to the corresponding latch circuit and a control signal to the transfer gate of the latch circuit at the next stage and an inverter 6 which inverts the output signal of NAND gate 5 and generates a control signal. The output signal of NAND gate 5 is applied to the control node of tri-state inverter buffer 4 of corresponding latch circuit LTa or LTc. The output signal of inverter 6 is applied to the control node of transfer gate 1 of corresponding latch circuit LTa or LTc.

Clock control circuit CTLb includes a NOR gate 7 which receives clock signal CLK transmitted from clock distribution circuit 10 to latch circuit LTb and a control signal to the transfer gate of the latch circuit (LTc) at the next stage. The output signal of NOR gate 7 is applied to the control node of latch circuit LTb and the output signal of inverter 8 is applied to the control node of the transfer gate of latch circuit LTb.

When an H-level signal is applied from clock control circuits CTLa and CTLc to the respective control nodes NA and NC of the transfer gates of latch circuits LTa and LTc, transfer gate 1 of each of latch circuit LTa and LTc turns conductive and each of latch circuits LTa and LTc enters a transparent state in which the received data is transmitted to the latch circuit at the next stage. In this operation, the output signal of NAND gate 5 is at L level and tri-state buffer 4 is in an output high-impedance state. By setting this tri-state inverter buffer 4 in an output high-impedance state during the transparent state, it is possible to prevent the collision of input data against data fed back from tri-state inverter buffer 4.

On the other hand, when the control signal of each of control nodes NA and NC of latch circuits LTa and LTc is at L level, transfer gate 1 of each of latch circuits LTa and LTc turns nonconductive and the data input node is isolated from the data output node of each of latch circuits LTa and LTc. In this state, the output data of each of latch circuits LTa and LTc does not change irrespectively of the change of the data inputted thereto and each of latch circuits LTa and LTc enters a latching state. In the latching state, tri-state inverter buffer 4 of each of latch circuits LTa and LTc is activated and a latch circuit is formed by inverter 2 and tri-state inverter buffer 4.

NOR gate 7 is employed in clock control circuit CTLb. Clock control circuit CTLa provided for latch circuit LTa and clock control circuit CTLb provided for latch circuit LTb generate complementary control signals to each other. That is, when latch circuit LTa enters a latching state, latch circuit LTb enters a transparent state. When latch circuit LTa turns into a transparent state, latch circuit LTb turns into a latching state. Likewise, when latch circuit LTb turns into a transparent state, latch circuit LTc turns into a latching state. When latch circuit LTb turns into a latching state, latch circuit LTc turns into a transparent state.

The latch circuits which complementarily turn into the latching state and the transparent state are alternately arranged and a control signal for each latch circuit is fed back to a clock control circuit for the latch circuit in the preceding stage and a control signal for the latch circuit in the preceding stage is generated. Thus, the control signals of these consecutive latch circuits can be made opposite in polarity. A control signal transmission path transmits a control signal between the two latch circuits which operate complementarily to each other. It is not necessary to wait for a control signal from the latch circuits in the subsequent stages to be transmitted, and an effective clock cycle for latch circuits LTa to LTc can be made sufficiently long.

Figure 28:
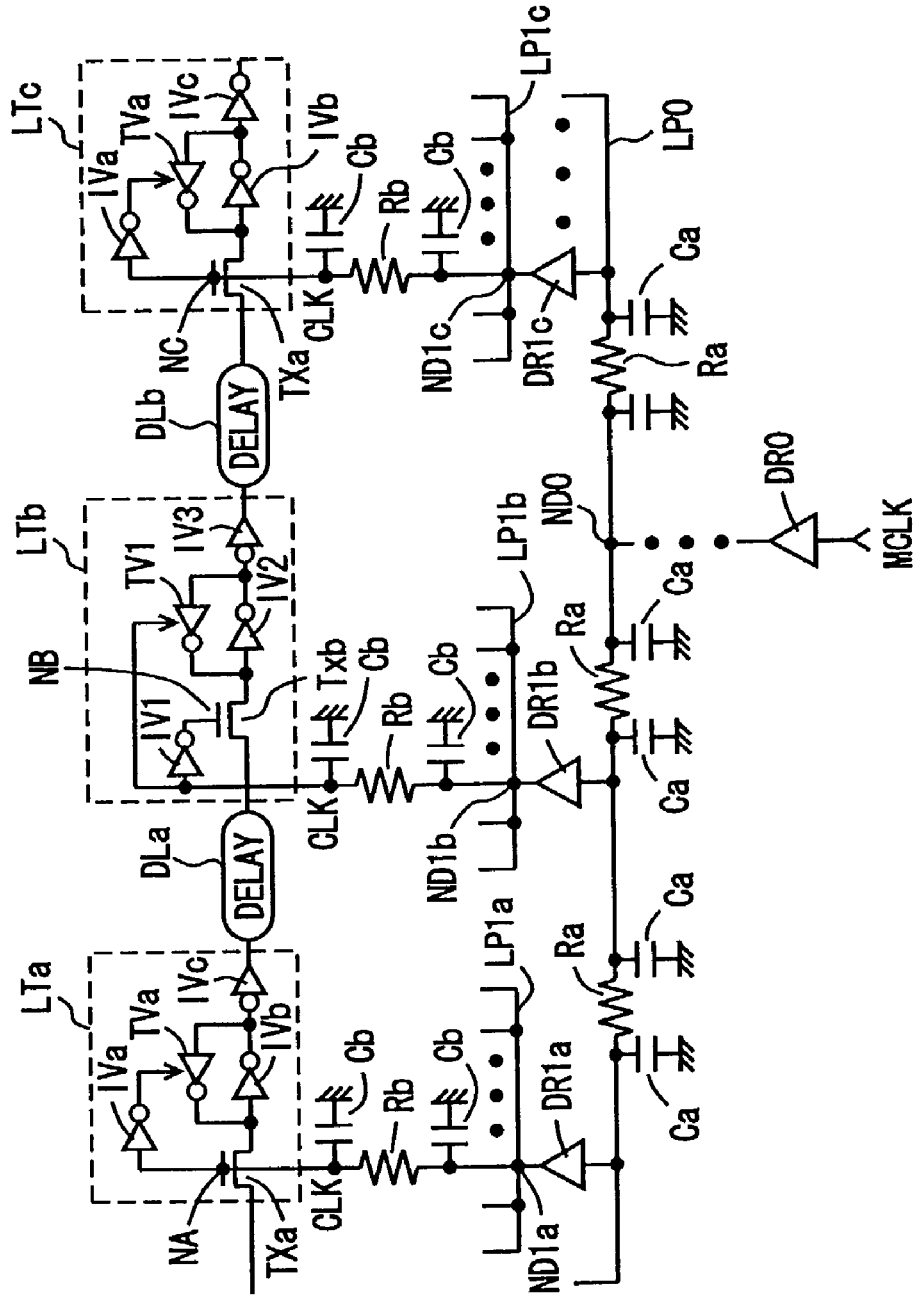
FIG. 28 is a block diagram of a conventional synchronous data transfer and processing device.
Figure 29:
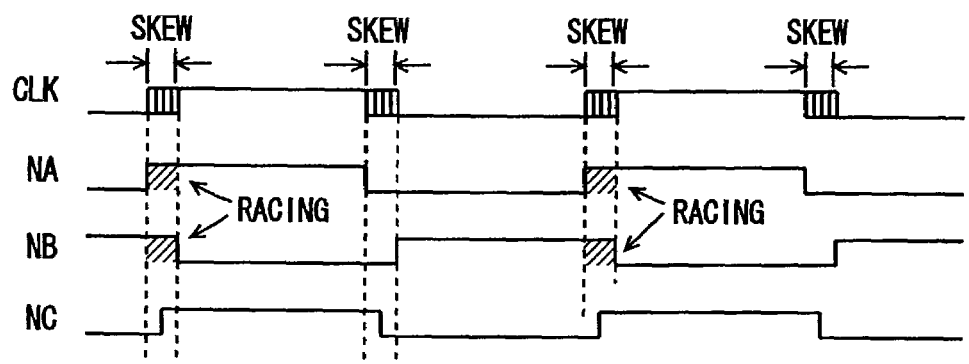
FIG. 29 is a timing chart representing the operations of circuit device shown in FIG. 28.
Figure 30:
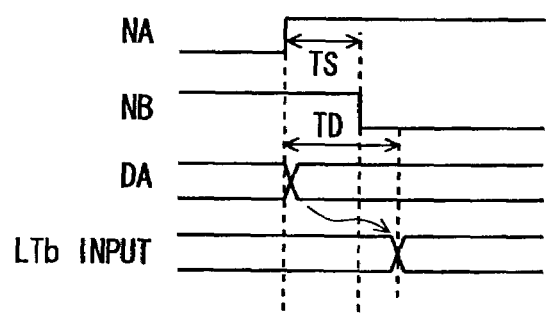
FIG. 30 is a timing chart representing the operations of the circuit device shown in FIG. 28 in more detail.
Figure 31:
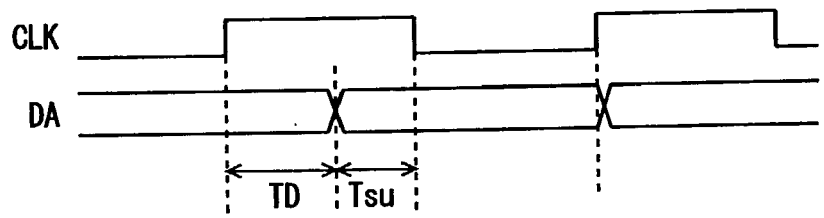
FIG. 31 shows the setup time of the circuit unit shown in FIG. 28.
Figure 32:
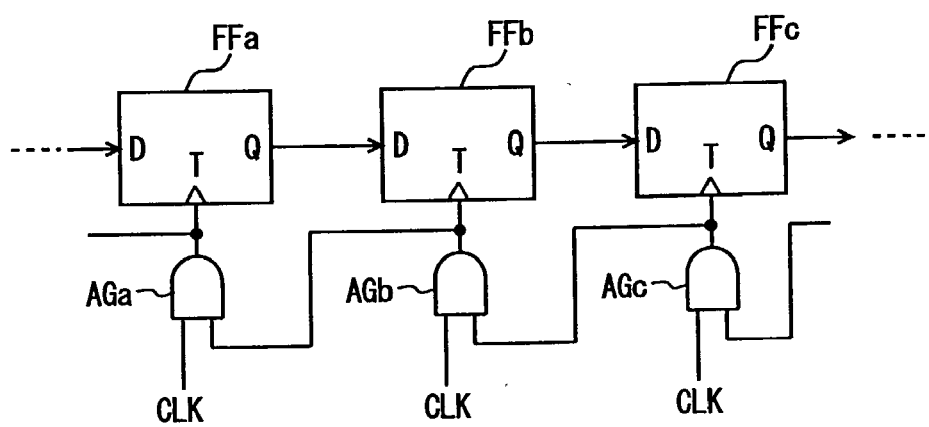
FIG. 32 is a schematic block diagram showing another configuration of the conventional synchronous data transfer and processing device.

Clock distribution circuit 10 has a clock tree structure as in the conventional clock distribution circuit as shown in FIG. 28, and generates clock control signals CLK for latch circuits LTa to LTc by transferring the master clock signal MCLK through a clock distribution path is arranged in a tree-like form. However, it suffices that this clock distribution circuit 10 is configured to distribute clock signals CLK for latch circuits LTa to LTc in accordance with master clock signal MCLK. Therefore, a clock distribution circuit of another clock distribution scheme such as a clock meshed type clock distribution circuit or a fishbone type clock distribution circuit may be employed.

Figure 1B:
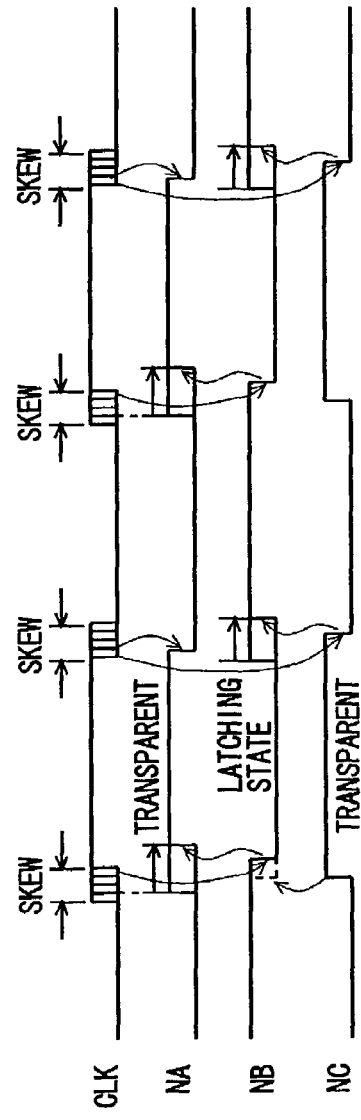
FIG. 1B is a timing chart representing the operations of circuit device shown in FIG. 1A.

FIG. 1B is a timing chart representing the operations of the synchronous data transfer and processing device shown in FIG. 1A. Referring to FIG. 1B, the operations of the circuit device shown in FIG. 1B will now be described.

In FIG. 1B, it is assumed that the delay time of clock signal CLK to latch circuit LTb is the longest and a delay of clock signal CLK to latch circuit LTc is the shortest. That is, a state is considered in which after clock signal CLK to latch circuit LTc changes, clock signal CLK to latch circuit LTa changes and then clock signal CLK for latch circuit LTb changes.

When clock signals CLK to latch circuits LTa to LTc are at L level, the output signal of NAND gate 5 is at H level and the output signal of inverter 6 is at L level in each of clock control circuits CTLa and CTLb. Therefore, in each of latch circuits LTa and LTc, transfer gate is in a nonconductive state and these latch circuits LTa and LTc are in a latching state.

In clock control circuit CTLb for latch circuit LTb, since the signal level of control node NC of latch circuit LTc is at L level, the output signal of NOR gate 7 of clock control circuit CTLb is at H level, transfer gate 1 of latch circuit LTb is conductive and latch circuit LTb is in a transparent state.

Master clock signal MCLK rises to H level and respective clock signals from clock distribution circuit 10 rise to H level, responsively. First, clock signal CLK to latch circuit LTc attains H level, the control signal at the control node (which is the control node of the transfer gate) of a latch circuit at the next stage, which is not shown, attains H level, and the output signal of NAND gate 5 of clock control circuit CTLc turns L level. Accordingly, the output signal of inverter 6 of clock control circuit LTc attains H level and latch circuit LTc turns into a transparent state.

When the control signal at control node NC of latch circuit LTc attains H level, the output signal of NOR gate 7 of clock control circuit CLTb attains L level as indicated by a broken line shown in FIG. 1B. When latch circuit LTc turns into a transparent state or corresponding clock signal CLK rises to H level, latch circuit LTb turns into a latching state. In FIG. 1A, a case where the rise of clock signal CLK to latch circuit LTb is earlier than the transition of the state of latch circuit LTc into the transparent state is indicated by a solid line and a case where the transition of the state of latch circuit LTc to the transparent state is earlier than the rise of clock signal CLK to latch circuit LTb is indicated by a broken line.

When latch circuit LTb turns into a latching state, inverter 8 of clock control circuit CTLb for latch circuit LTb outputs a signal at H level.

When clock signal CLK to latch circuit LTa rises to H level and latch circuit LTb turns into a latching state, the output signal of NAND gate 5 of clock control circuit CTLa attains L level. Accordingly, the output signal of inverter 6 of clock control circuit CTLa attains H level, the control signal of control node NA of latch circuit LTa attains H level and latch circuit LTa turns into a transparent state and transmits a received signal to latch circuit LTb.

If clock signal CLK to latch circuit LTa remains L level even if latch circuit LTb turns into a latching state, the control signal at control node NA of latch circuit LTa is at L level and latch circuit LTa remains in a latching state. When clock signal CLK to latch circuit LTa attains H level, then latch circuit LTa turns into a transparent state.

Therefore, this latch circuit LTa turns into a transparent state when latch circuit LTb at the next stage turns into a latching state and corresponding clock signal CLK attains H level to instruct a transparent state.

Then, when master clock signal MCLK falls from H level to L level, clock signals CLK to latch circuits LTa to LTc applied from clock distribution circuit 10 fall to L level, respectively. In this case, clock signal CLK to latch circuit LTc changes to L level earliest and latch circuit LTc turns into a latching state in response to the fall of clock signal CLK to latch circuit LTc.

When latch circuit LTc turns from a transparent state into a latching state, clock signal CLK to latch circuit LTb attains L level and the signal at control node NC of latch circuit LTc attains L level responsively. After latch circuit LTc turns into a latching state, the signal at control node NB of latch circuit LTb is driven to H level by NOR gate 7 of clock control circuit CTLb to latch circuit LTb and latch circuit LTb turns into a transparent state.

When latch circuit LTb enters a latching state, clock signal CLK to latch circuit LTa attains L level. Responsively, the output signal of inverter 6 of clock control circuit CTLa attains L level and latch circuit LTa turns into a latching state. Therefore, latch circuit LTa turns into a latching state when latch circuit LTb turns into a transparent state or corresponding clock signal CLK attains H level.

Consequently, even if a clock skew exists, each of the latch circuits turns into a transparent state when the latch circuit at the next stage turns into a latching state and the corresponding clock signal turns into a state of instructing the transparent state. In addition, when any latch circuit turns into a latching state is when the latch circuit at the next stage turns into a transparent state or the corresponding clock signal instructs a latching state. Therefore, when the state of the latch circuit at the next stage transitions to a transparent state, the latch circuit in the immediately preceding stage turns into a latching state. Thus, it is possible to prevent both of the latch circuits in two consecutive stages from turning into the transparent state. Even if a clock skew occurs, a piercing of the signal is not caused.

Furthermore, when any latch circuit turns into the transparent state is when the latch circuit at the next stage turns into a latching state and the corresponding clock signal instructs a transparent state. In this case, therefore, it is possible to prevent two consecutive latch circuits from turning into the transparent state to prevent piercing of a signal.

Data is sequentially transferred from latch circuit LTa toward latch circuit LTc in accordance with clock signals CLK. When the control signals at control nodes NA and NC are at H level, the control signal at control node NB is at L level. Conversely, if the control signals at control nodes NA and NC are at L level, the control signal at control node NB is at H level. Accordingly, a control signal to the latch circuit in an odd stage and a control signal to the latch circuit in an even stage are generated complementarily to each other (exclusively of each other).

A condition for turning a latch circuit (LTa, LTc) in an odd stage into the transparent state in the above-stated arrangement of the latch circuits is that corresponding clock signal CLK is at H level and the latch circuit at the next stage is in the latching state. On the other hands, a condition for turning a latch circuit in the odd stage into the latching state is that the corresponding clock signal CLK is at L level or the latch circuit at the next stage is in the transparent state.

Conditions for turning the latch circuit (LTb) in the even stage into a transparent state are that corresponding clock signal CLK is at L level and the latch circuit at the next stage is in a latching state. Conditions for turning the latch circuit in the even stage into a latching state are that corresponding clock signal CLK is at H level or the latch circuit at the next stage turns into a transparent state.

To satisfy these conditions, the clock control circuits (CTLa, CTLc) for the latch circuits in the odd stages are each implemented by a combination of NAND gate 5 and inverter 6 and the clock control circuit (CTLB) for the latch circuit in the even stage (LTb) is implemented by a combination of the two-input NOR gate and the inverter.

Figure 2:
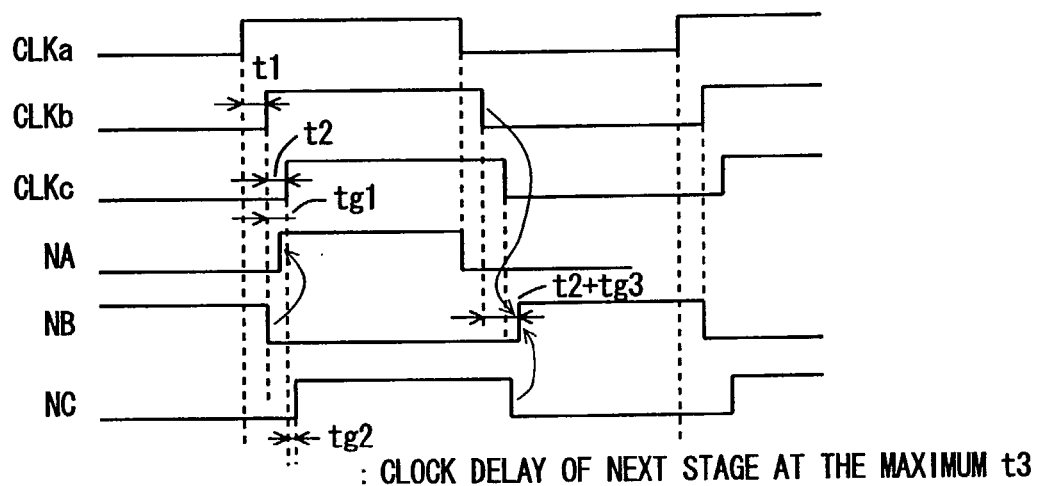
FIG. 2 is a timing chart of the control signals of a clock control circuit shown in FIG. 1A.

FIG. 2 is a timing chart representing the changes of the clock signals and the signals of the respective control nodes in the synchronous data transfer and processing device shown in FIG. 1A. In FIG. 2, clock signals CLK to latch circuits LTa to LTc are denoted by clock signals CLKa, CLKb and CLKc, respectively. In addition, clock signals CLKa, CLKb and CLKc have increased delay times in this order, clock signal CLKb has delay time t1 relative to clock signal CLKa and clock signal CLKc has delay time t2 relative to clock signal CLKb.

In this condition, the signal at control node NB falls to L level when clock signal CLKb falls to L level. When the signal at control node NB falls to L level, since clock signal CLKa is at H level, the control signal at control node NA rises to H level responsively. Control node NA rises in signal level to H level after elapse of time, t1+tg1, from the rise of corresponding clock signal CLK. It is noted that time period tg1 indicates signal propagation delay time in clock control circuit CTLa.

The control signal at control node NC rises to H level when the control signal to the latch circuit at the next stage falls to L level. Therefore, node NC attains H level when clock signal CLKc rises to H level and the control node of the latch circuit at the next stage attains L level. The delay time of the rise of the control signal at control node NC to the rise of clock signal CLKc ranges from the maximum time of a phase delay time t3 of the control clock signal to the latch circuit at the next stage relative to clock signal CLKc to the minimum time of the gate delay time tg2 of the corresponding clock control circuit.

When clock signal CLKa falls to L level, control node NA falls to L level in response to the fall of clock signal CLKa. Control node NC falls to L level in response to the fall of clock signal CLKc. Therefore, control node NB attains H level when clock signal CLKb attains L level and the control signal of control node NC attains L level. Accordingly, the delay time of the rise of the signal of control node NB is equal to the sum of delay time t2 of clock signal CLKc relative to clock signal CLKb and signal propagation delay time tg3 of clock control circuit to latch circuit LTb.

Figure 3:
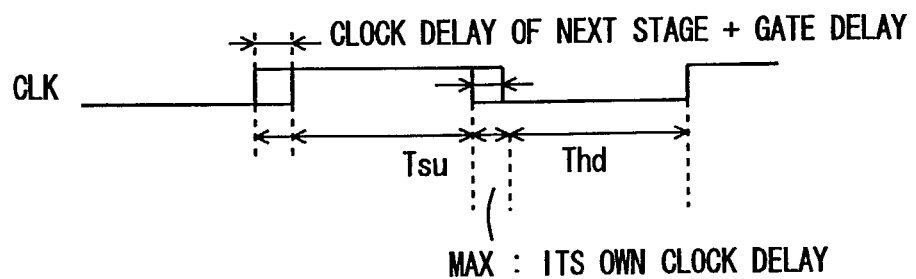
FIG. 3 shows setup/hold time of the synchronous data transfer and processing device shown in FIG. 1A.

As shown in FIG. 2, the reduction o f cycle time due to the detection of the state of the latch circuit at the next stage is equal, at the maximum, to the sum of the phase delay time of the clock signal to the latch circuit at the next stage relative to the its own clock signal and the signal propagation delay of the clock control circuit in each of the latch circuits. Therefore, each of the latch circuits has the transparent state determined by the state of the latch circuit at the next stage and the corresponding clock signal CLK and the latching state determined by the corresponding clock signal CLK or the transparent state of the latch circuit at the next stage. Accordingly, a time period in which the latch circuit is in an effective transparent state is shortened, at the maximum, by the sum of the delay of the clock signal to the latch circuit at the next stage and the gate propagation delay of the clock control circuit of a single stage, as compared to the clock cycle period. As shown in FIG. 3, therefore, it is possible to sufficiently secure hold time Thd and setup time Tsu for each clock signal CLK and to ensure the transmission of a signal/data at high speed. In FIG. 3, the hold time and setup time for clock signal CLK with respect to the latch circuit in the odd stage are shown. Setup time Tsu is a time period required for maintaining the signal/data into a definite state before entry into a latching state. Hold time Thd is a time period required for holding the data in a latching state in the corresponding latch circuit after this setup time, and hold time Thd is equal to a time period of the latching state of the corresponding latch circuit.

As shown in FIG. 1A, therefore, with a configuration in which the state of the latch circuit at the next stage is detected and the corresponding latch circuit is driven into a transparent state, it is possible to dispense with a delay circuit or the like for prevention of racing and to decrease the number of components. In addition, a sufficient effective cycle time can be secured upon revision of the clock signal timing based on the result of timing verification. Therefore, if the setup time is secured, a sufficient hold time can be naturally secured to eliminate the revision of the hold time due to an insufficient hold time, resulting in facilitating timing verification. In other words, it is possible to hold the data for a sufficient period of time (hold time Thd) in a latching state. Therefore, if a sufficient setup time can be ensured in a transparent state, the hold time can be also ensured. Thus, there is no need for a test of discriminating whether or not the hold time is sufficient, readily performing the timing verification.

In FIG. 1A, as a latch circuit, inverters are employed and the signal is sequentially transferred using the transfer gates.

Alternatively, any circuit configuration for the latch circuit can be used as long as the transparent state and the latching state are implemented according to clock signal CLK. For example, such a latch circuit to transmit complementary data using cross-coupled NAND gates or NOR gates may be used. In this alternative, the clock control circuit shown in FIG. 1A is arranged for each of the transfer gates at the input stage of the latch circuit for the even and odd stages.

Further, the latch circuits may be arranged such that the latch circuit in the odd stage turns into a latching state in response to the rise of corresponding clock signal and the latch circuit in the even stage turns into a transparent state in response to the rise of the corresponding clock signal in a string of the latch circuits.

As stated so far, according to the first embodiment of the present invention, the latch circuits which complementarily turn into latching state/transparent state are alternately arranged, and the latching state of the latch circuit at the next stage is detected to permit the transition of the state of the latch circuit in the preceding stage of the transparent state. Therefore, it is possible to prevent the consecutive latch circuits from simultaneously turning into the transparent state to prevent the occurrence of the racing of signals. Furthermore, the latch circuits which complementarily turn into the transparent state/latching state are alternately arranged. A maximum of the cycle time in the transparent state or the maximum of the cycle time in the latching state is equal to the sum of the phase delay of the clock signal to the next stage and the gate delay of the its own circuit or to the delay of the clock signal to it s own circuit. It is, therefore, possible to prevent the clock cycle time in the transparent state from becoming shorter and to ensure sufficient setup time and hold time.

Second Embodiment

Figure 4:
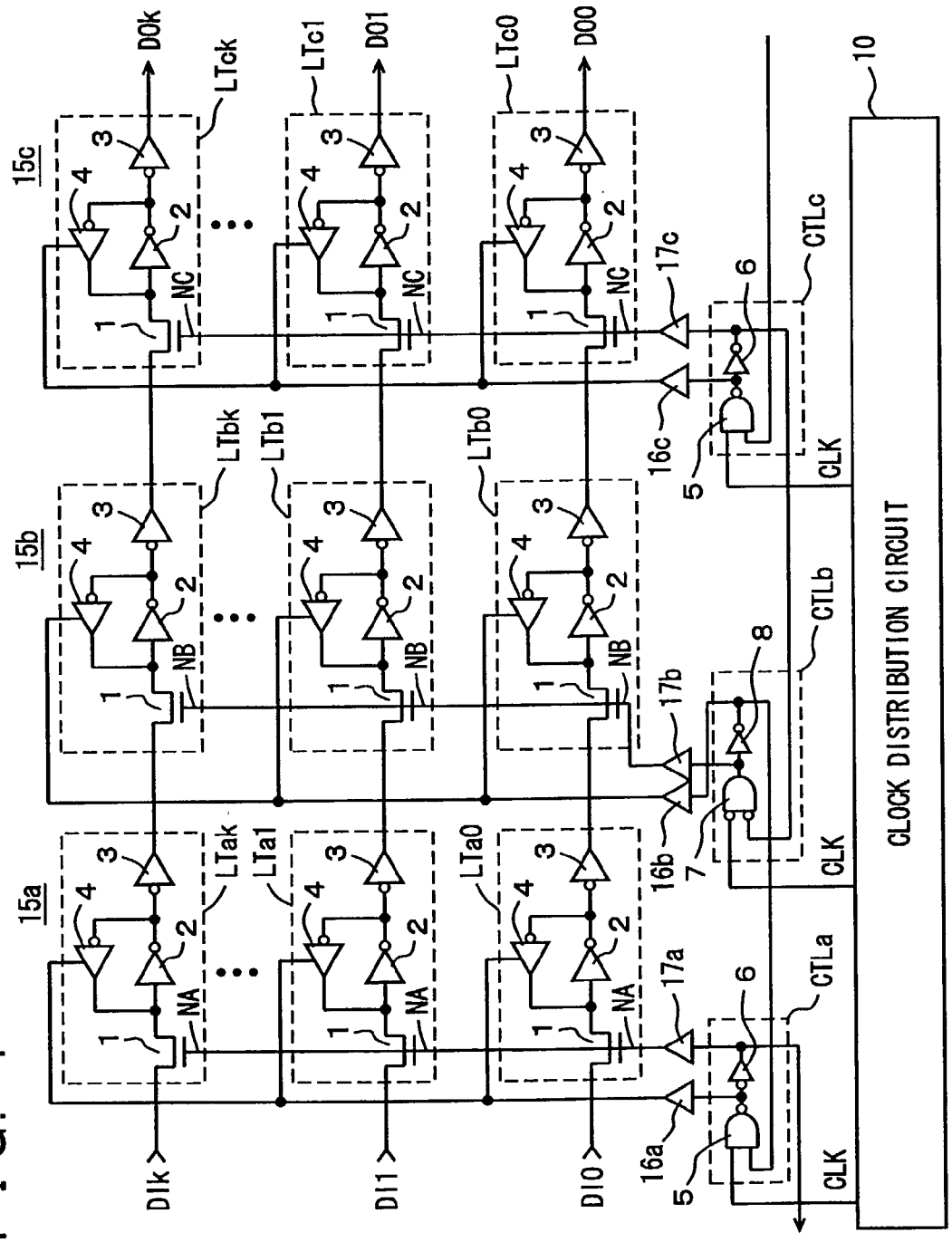
FIG. 4 is a block diagram of a synchronous data transfer and processing device according to a second embodiment of the present invention.

FIG. 4 is a block diagram of a synchronous data transfer and processing device according to the second embodiment of the present invention. In FIG. 4, this synchronous data transfer and processing device includes a plurality of cascaded multi-bit transfer circuits. In FIG. 4, multi-bit transfer circuits 15a to 15c cascaded in three stages are representatively shown. Multi-bit transfer circuit 15a includes latch circuits LTa0 to LTak which transmit input data DI0 to DIk, respectively in parallel. Multi-bit transfer circuit 15b includes latch circuits LTb0 to LTbk which are arranged corresponding to latch circuits LTa0 to LTak of multi-bit transfer circuit 15a, respectively. Multi-bit transfer circuit 15c include latch circuits LTc0 to LTck which are arranged corresponding to latch circuits LTb0 to LTbk of multi-bit transfer circuit 15b, respectively. These latch circuits LTa0 to LTb1, LTb0 to LTbk and LTc0 to LTck have the same configuration. Each of the latch circuits includes a transfer gate 1, inverters 2 and 3 cascaded in two stages and a tri-state inverter buffer 4 which is selectively activated in accordance with a control signal.

A clock control circuit CTLa is arranged corresponding to multi-bit transfer circuit 15a. A clock control circuit CTLb is arranged corresponding to multi-bit transfer circuit 15b. A clock control circuit CTLc is arranged corresponding to multi-bit transfer circuit 15c. Clock control circuits CTLa and CTLc provided corresponding to multi-bit transfer circuits 15a and 15c at odd stages have the same configuration. Each of clock control circuits CTLa and CTLc includes a NOR gate 5 which receives a corresponding clock signal CLK from a clock distribution circuit 10 and a control signal outputted from the clock control circuit arranged for the multi-bit transfer circuit at the next stage, and an inverter 6 which receives the output signal of NAND gate 5.

Clock control circuit CTLb arranged corresponding to multi-bit transfer circuit 15b in the even stage includes a NOR gate 7 which receives a corresponding clock signal CLK from clock distribution circuit 10 and a control signal outputted from the clock control circuit provided for the multi-bit transfer circuit at the next stage, and an inverter 8 which receives the output signal of NOR gate 7.

Local clock drivers 16 and 17 are arranged to control the operations of a plurality of latch circuits included in the corresponding multi-bit transfer circuits 15a to 15c in common. Specifically, a local clock driver 16a which buffers the output signal of NAND gate 5 of clock control circuit CTLa and drives the tri-state inverter buffers of latch circuits LTa0 to LTak with a large driving capability, and a local clock driver 17a which receives the output signal of inverter 6 of corresponding clock control circuit CTLa and drives transfer gates 1 of latch circuits LTa0 to LTak provided for multi-bit transfer circuit 15a.

Local clock drivers 16b and 17b are provided for multi-bit transfer circuit 15b. Local clock driver 16b drives tri-state inverter buffers 4 of latch circuits LTb0 to LTbk in common in accordance with the output signal of inverter 8 of clock control circuit CTLb. Local clock driver 17b drives transfer gates 1 of latch circuits LTb0 to LTbk in common in accordance with the output signal of NOR gate 7 of clock control circuit CTLb.

Local clock drivers 16c and 17c are provided for multi-bit transfer circuit 15c. Local clock driver 16c drives tri-state inverter buffers 4 of latch circuits LTc0 to LTck in common in accordance with the output signal of NAND gate 5 of clock control circuit CTLc. Local clock driver 17c drives transfer gates 1 of latch circuits LTc0 to LTck in common in accordance with the output signal of inverter 6 of clock control circuit CTLc.

As shown in FIG. 4, where multi-bit transfer circuits transferring multi-bit data are arranged, clock control circuits are provided corresponding to the respective multi-bit transfer circuits. A plurality of latch circuits included in each of multi-bit transfer circuits 15a to 15c are driven in common by a corresponding one of clock control circuits CTLa to CTLc. Thus, even if a plurality of latch circuits are provided in the multi-bit transfer circuit, it is possible to decrease a circuit occupation area by providing a clock control circuits common to the plurality of latch circuits in a corresponding multi-bit transfer circuit.

If a plurality of latch circuits are driven in common, the load of a driving signal line increases. In order to drive this load at high speed, local drivers 16 (16a to 16c) and 17 (17a to 17c) are provided to drive the control signal line having a heavy load at high speed. The transfer operation of the latch circuits per bit of multi-bit transfer circuits 15a to 15c is the same as that described in the first embodiment. Specifically, multi-bit transfer circuits 15a to 15c alternately turn into the latching state and the transparent state. If the multi-bit transfer circuit in the preceding stage is in a latching state, the multi-bit transfer circuit at the next stage is in a transparent state. In addition, when the latch circuit at the next stage turns into a latching state, the multi-bit transfer circuit at the next stage is allowed to turn into a transparent state.

As shown in FIG. 4, by arranging one common clock control circuit for a plurality of latch circuits arranged in parallel and included in each multi-bit transfer circuit, it is possible to decrease the overhead of the circuitry for the control of transfer operations. In addition, the number of components can be decreased, and a layout area and power dissipation can be reduced, accordingly.

Third Embodiment

Figure 5:
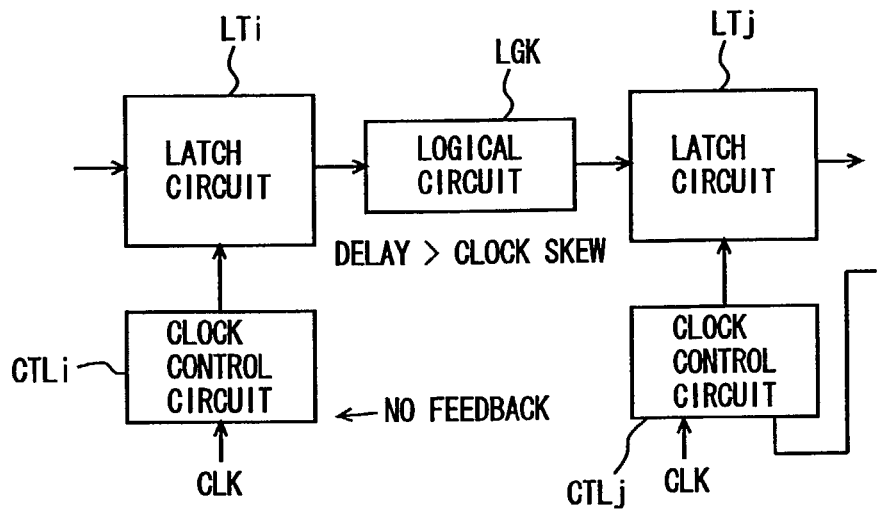
FIG. 5 is a schematic block diagram showing a construction of a synchronous data transfer and processing device according to a third embodiment of the present invention.

FIG. 5 is a schematic block diagram showing a configuration of a synchronous data transfer and processing device according to the third embodiment of the present invention. In FIG. 5, a logical circuit LGK is interposed between latch circuits LTi and Ltg. The signal propagation delay time of logical circuit LGK is longer than a clock skew.

If the number of logical stages of logical circuit LGK is great and the gate delay thereof is longer than a clock skew, a delay circuit for preventing racing is equivalently arranged in the signal/data transfer path and no racing problem occurs in latch circuits LTi and LTj. Therefore, a control signal is not fed back from clock control circuit CTLj provided for latch circuit LTj to clock control circuit CTLi provided for this latch circuit LTi. Clock control circuit CTLi controls the state of latch circuit LTi in accordance with corresponding clock signal CLK. On the other hand, since there is a possibility that a racing problem occurs between latch circuit LTj and the latch circuit at the next stage, clock control circuit CTLj receives a control signal fed back from a clock control circuit provided for the latch circuit at the next stage.

Figure 6:
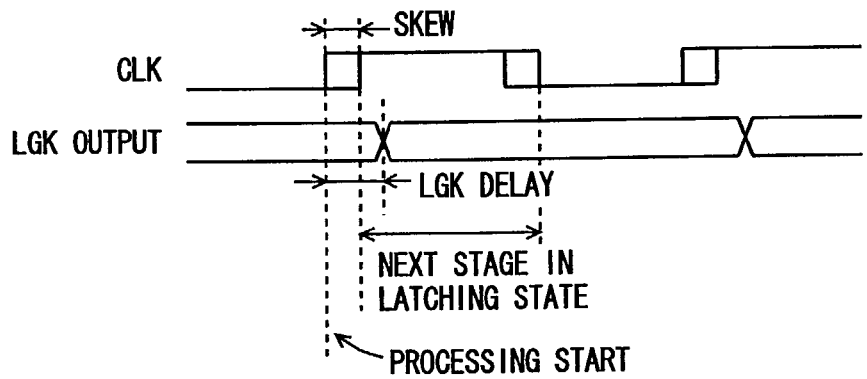
FIG. 6 is a timing chart representing the operations of circuit device shown in FIG. 5.

Specifically, with reference to shown in FIG. 6, the case is considered where the clock skew of clock signal CLK is shorter than the gate delay of logical circuit LGK. In this condition, even if latch circuit LTi turns into a transparent state in accordance with clock signal CLK and latch circuit LTj at the next stage turns into a transparent state concurrently, latch circuit LTj will already be in a latching state when the output signal of logical circuit LGK is transmitted to latch circuit LTj. Accordingly, latch circuit LTj latches the signal transmitted from logical circuit LGK in a preceding cycle, thereby causing no racing problem.

FIG. 6 shows a state in which latch circuit LTi turns into a transparent state in response to the rise of clock signal CLK. However, even if this latch circuit LTi is the latch circuit in an even stage and turns into the transparent state in response to the fall of clock signal CLK, no racing problem occurs, either. By inverting the logical level of clock signal CLK in FIG. 6, it is possible to obtain an operation state in which logical circuit LGK receives the output data of the latch circuit at the even stage and transfers the received data to the latch circuit at the odd stage.

As shown in FIG. 5, therefore, where logical circuit LGK is arranged between two consecutive latch circuits LTi and LTj and the gate delay of logical circuit LGK is longer than a clock skew, latch circuit LTi at the preceding stage of logical circuit LGK can be controlled in accordance with corresponding clock signal CLK, with the simulation that the latch circuit at the next stage is in a latching state. As a result, it is possible to set latch circuit LTi in a transparent state without consideration to a clock skew, to transfer data to the logical circuit at an advanced timing in accordance with clock signal CLK, to lengthen the processing time period of logical circuit LGK, to allow the logical circuit LGK to perform accurate logical processing even if a high-speed clock signal is employed.

[Modification]

Figure 7:
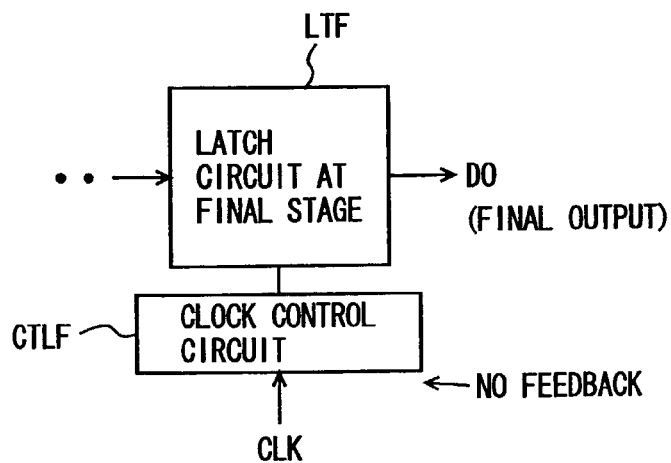
FIG. 7 is a schematic block diagram of the modification of the third embodiment of the present invention.

FIG. 7 is a schematic block diagram of the modification of the third embodiment of the present invention. In FIG. 7, a clock control circuit CTLF provided for a latch circuit LTF at the final stage of the signal/data transfer path controls the state of latch circuit LTF in accordance with a clock signal CLK. Since the output data DO of latch circuit LTF at the final stage is processed by another processing device or outputted externally, no latch circuit is present at the next stage of latch circuit LTF. Therefore, it is not necessary to consider a racing problem for latch circuit LTF at the final stage. Clock control circuit CTLF simulates that the latch circuit at the next stage thereof is in a latching state and controls the state of latch circuit LTF at the final stage in accordance with clock signal CLK. As a result, it is possible to set final output data DO in a definite state at a fast timing in accordance with clock signal CLK and to thereby achieve high-speed data transfer.

Consequently, with the configuration in which data propagation delay time is long or there is no need to consider the state of the circuit at the next stage as in the case of the final output stage, it is possible to transfer data at early timing and to realize high-speed data transfer processing by pseudo-controlling that the latch circuit at the next stage is in a latching state and controlling the operation of the corresponding latch circuit.

[First Specific Example of Configuration of Clock Control Circuit]

Figure 8:
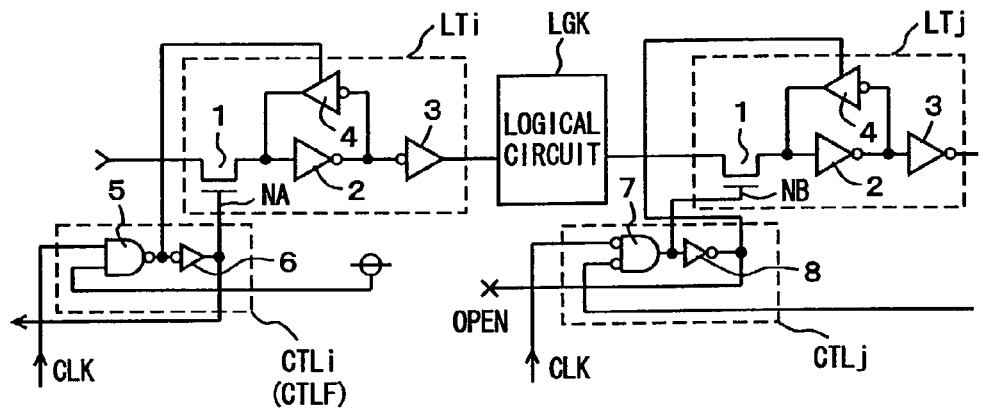
FIG. 8 shows a specific configuration of clock control circuits according to the third embodiment of the present invention.

FIG. 8 shows the specific configuration of the clock control circuit in the synchronous data transfer and processing device according to the third embodiment of the present invention. In FIG. 8, logical circuit LGK is arranged between latch circuit LTi at an odd stage and latch circuit LTj at an even stage. According to the configuration as shown in the figure, a feedback path of the control signal of clock control circuit CTLj provided for latch circuit LTj in the even stage is set in an open state. On the other hand, in clock control circuit CTLi provided for latch circuit LTi in the odd stage, NAND gate 5 receives clock signal CLK and a signal fixed to H level (power supply voltage level). In this case, therefore, NAND gate 5 in clock control circuit CTLi normally operates as an inverter and inverts clock signal CLK. Responsively, latch circuit LTi turns into a latching state/transparent state in accordance with the corresponding clock signal CLK from the clock control circuit CTLi.

If latch circuit LTF at the final stage shown in FIG. 7 is constituted of the latch circuit at the odd stage, corresponding clock control circuit CTLF has the same configuration as that of clock control circuit CTLi shown in FIG. 8 and NAND gate 5 provided at the input of clock control circuit CTLF receives corresponding clock signal CLK and the signal fixed to the power supply voltage level.

[Second Specific Example of the Configuration of Clock Control Circuit]

Figure 9:
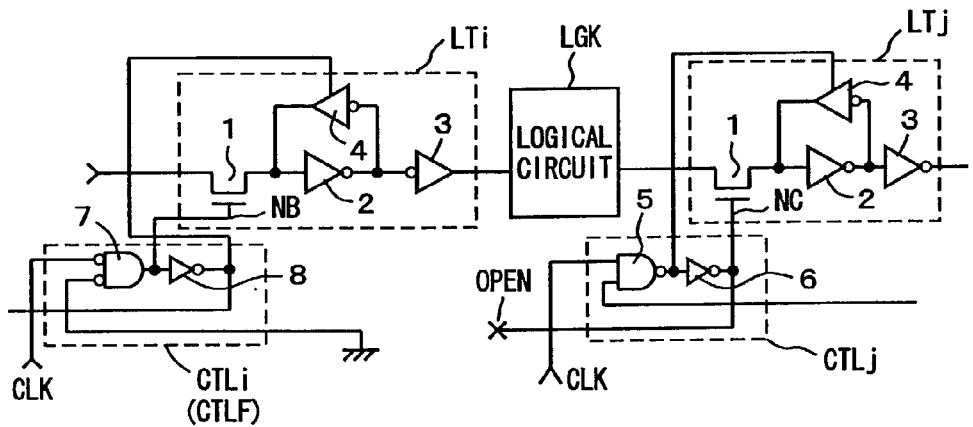
FIG. 9 shows another configuration of the clock control circuits according to the third embodiment of the present invention.

FIG. 9 shows another specific example of the configuration of the cock control circuit according to the third embodiment of the present invention. In FIG. 9, logical circuit LGK is arranged between latch circuit LTj in the even stage and latch circuit LTi in the odd stage. According to this configuration, a feedback path of the output control signal of inverter 6 in clock control circuit CTLi is set in an open state (no contact is formed). On the other hand, NOR gate 7 of clock control circuit CTLj receives corresponding clock signal CLK and a control signal fixed to ground voltage level. NOR gate 7 operates as an inverter, and transfer gate 1 and tri-state inverter buffer 4 in latch circuit LTj are controlled in accordance with clock signal CLK.

In a case that logical circuit LGK is arranged at the next stage of latch circuit LTj in the even stage and the gate delay of logical circuit LGK is greater than a clock skew, corresponding clock control circuit CTLi receives the signal fixed to ground voltage level in stead of the fed back control signal, so that latch circuit LTj can be set into the latching state/transparent state in accordance with corresponding clock signal CLK. By setting latch circuit LTj in a transparent state in response to the fall of clock signal CLK, data is transmitted to logical circuit LGK in response to the fall of corresponding clock signal CLK irrespectively of the state of latch circuit LTi at the next stage and it is, therefore, possible to increase the processing time of logical circuit LGK.

If latch circuit LTF at the final stage shown in FIG. 7 is the latch circuit in the even stage as shown in FIG. 9, clock control circuit CTLF provided for latch circuit LTF at the final stage has the same configuration as that of clock control circuit CTLj shown in FIG. 9.

Where a logical circuit is interposed between the latch circuits and the delay time of the logical circuit is long, in particular, it is possible to increase the processing time of the logical circuit by controlling the operation of the latch circuit in the preceding stage synchronously with the clock signal. In addition, the control signal feedback path of the corresponding latch circuit at the next stage is simply set in an open state and a voltage fixed to either power supply voltage level or ground voltage level is simply used instead of the fed back control signal, and the configuration of the clock control circuit remains unchangedly. Therefore, irrespectively of the position at which logical circuit LGK is interposed, it is possible to use the same clock control circuit layout. Only by switching the feedback control signal path by a mask interconnection line or the like, it is possible to easily change the operation timing of the latch circuit and to achieve a data transfer and processing device having wide versatility.

Fourth Embodiment

Figure 10:
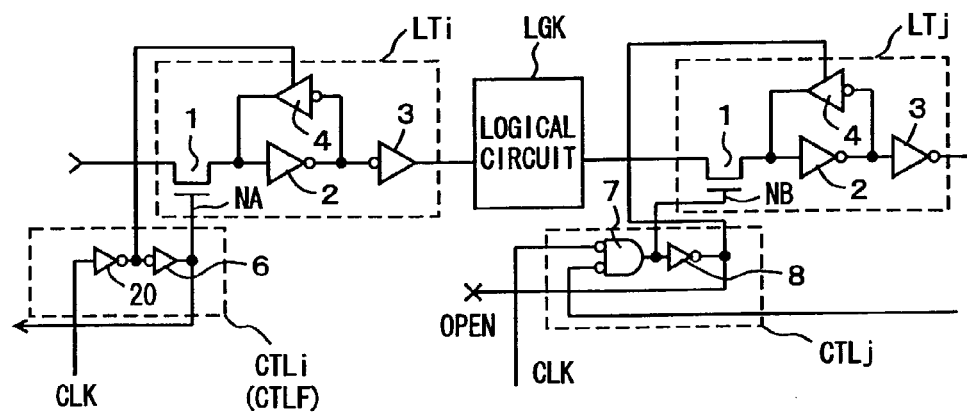
FIG. 10 is a block diagram of a synchronous data transfer and processing device according to a fourth embodiment of the present invention.

FIG. 10 is a block diagram of clock control circuits according to the fourth embodiment of the present invention. According to the configuration shown in FIG. 10, a logical circuit LGK having a longer gate delay than a clock skew is interposed between a latch circuit LTi in an odd stage and a latch circuit LTj in an even stage. In this case, a clock control circuit CTLi provided for latch circuit LTi in the odd stage includes an inverter 20 which receives a corresponding clock signal CLK from a clock distribution circuit (not shown in FIG. 10) and an inverter 6 which receives the output signal of inverter 20. The operation of a tri-state inverter buffer 4 of latch circuit LTi is controlled according to the output signal of inverter 20. The operation of a transfer gate 1 of latch circuit LTi is controlled according to the output signal of inverter 6.

A clock control circuit CTLj provided for latch circuit LTj in the even stage includes a NOR gate 7 which receives corresponding clock signal CLK and a fed back signal from the next stage for clock control, and an inverter 8 which controls the operation of tri-state inverter buffer 4 of latch circuit LTj according to the output signal of NOR gate 7. A feedback path of a control signal outputted from inverter 8 is held in an open state.

In the case of the configuration of clock control circuits shown in FIG. 10, the gate delay of logical circuit LGK is longer than a clock skew and latch circuit LTi can be set to a transparent state in accordance with corresponding clock signal CLK without consideration to the clock skew as in the case of the preceding third embodiment. Therefore, by employing inverter 20 which receives corresponding clock signal CLK instead of the NAND gate, it is possible to decrease the circuit scale of clock control circuit CTLi and to set latch circuit LTi in a transparent state at early timing.

Furthermore, if latch circuit LTF at the final stage is the latch circuit in the odd stage as shown in FIG. 7, corresponding clock control circuit CTLF is constituted of cascaded two stages of inverters receiving the corresponding clock signals from the clock distribution circuit. As a result, it is possible to output the final data at a fast timing, achieving a high-speed data transfer.

[Modification]

Figure 11:
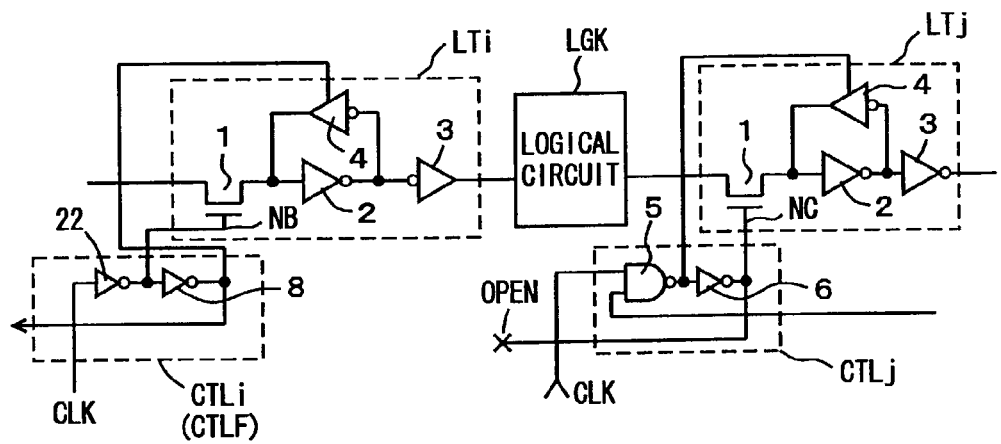
FIG. 11 is a block diagram of the modification of the fourth embodiment of the present invention.

FIG. 11 is a diagram showing a configuration of the modification of the synchronous data transfer and processing device according to the fourth embodiment of the present invention. According to the configuration shown in FIG. 11, a logical circuit LGK is interposed between a latch circuit LTj in an even stage and a latch circuit LTi in an odd stage. Logical circuit LGK performs a predetermined processing on data received from latch circuit LTi and data, if necessary, from another latch circuit which is not shown, and outputs the processing result to at least a latch circuit at the next stage.

As in the case of the configuration described in the preceding third embodiment and that shown in FIG. 10, the gate delay of logical circuit LGK is longer than a clock skew. Therefore, a clock control circuit CTLj provided for this latch circuit LTj is consists of cascaded two stages of inverters 22 and 8 receiving corresponding clock signals CLK from a clock distribution circuit. The output signal of inverter 22 is applied to the control node NB of a transfer gate 1 of latch circuit LTj and the output signal of inverter 8 is applied to the control node of the tri-state inverter buffer 4 of latch circuit LTj.

On the other hand, a clock control circuit CTLi provided for latch circuit LTi includes a NOR gate 5 which receives corresponding clock signal CLK and a fed back control signal from a clock control circuit at the next stage, and an inverter 6 which controls transfer gate 1 of latch circuit LTi in accordance with the output signal of NOR gate 5. A feedback path of a control signal outputted from inverter 6 is kept in an open state.

Consequently, even with the configuration shown in FIG. 11, latch circuit LTj turns into the transparent state in response to the rise of clock signal CLK, data is transmitted to logical circuit LGK at a fast timing without consideration on the clock skew and the state of latch circuit LTi at the next stage, and thus the processing time of logical circuit LGK can be increased.

In clock control circuit CTLj shown in FIG. 11, inverter 22 is simply employed in place of the NOR gate, and the circuit scale of clock control circuit CTLj can be reduced.

Furthermore, as shown in FIG. 7, if latch circuit LTF at the final stage is the latch circuit at the even stage and latch circuit LTj generates final output GO, corresponding clock control circuit CTLF is constituted of cascaded inverters 22 and 8 of two stages. As a result, even if latch circuit LTF at the final stage is the latch circuit at the even stage, final output data can be outputted at a faster timing by constituting corresponding clock control circuit CTLF of the cascaded inverters of two stages and by controlling the state of the latch circuit at the final stage in accordance with corresponding clock signal CLK from the clock distribution circuit.

As stated so far, according to the fourth embodiment of the present invention, if there is no need to consider the state of the circuit at the next stage in transfer of a signal to the circuit at the next stage, the clock control circuit is constituted of cascaded inverters of two stages. It is, therefore, possible to transmit data to the circuit at the next stage at a faster timing and to reduce the circuit scale of each clock control circuit. Besides, if a logical circuit is provided at the next stage and the gate delay of the logical circuit is long, it is possible to transmit data at a faster timing and to secure sufficient processing time for the logical circuit.

Fifth Embodiment

Figure 12:
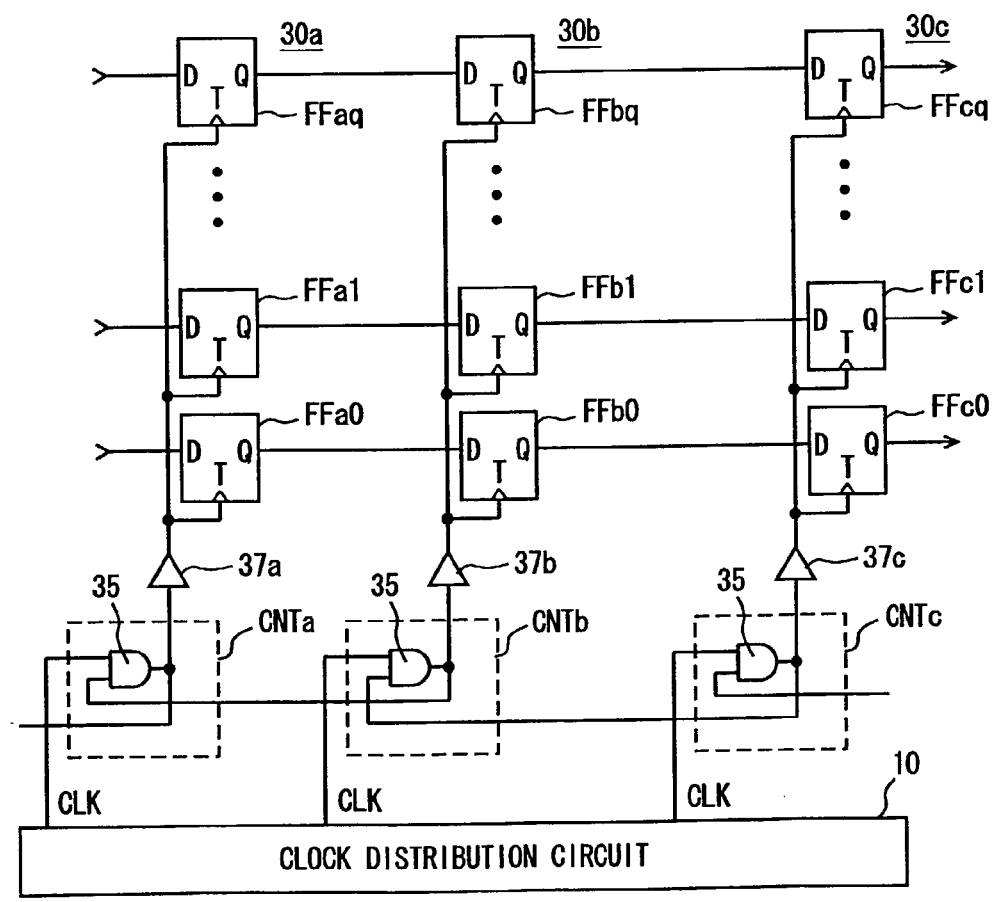
FIG. 12 is a schematic block diagram of a synchronous data transfer and processing device according to a fifth embodiment of the present invention.
Figure 33:
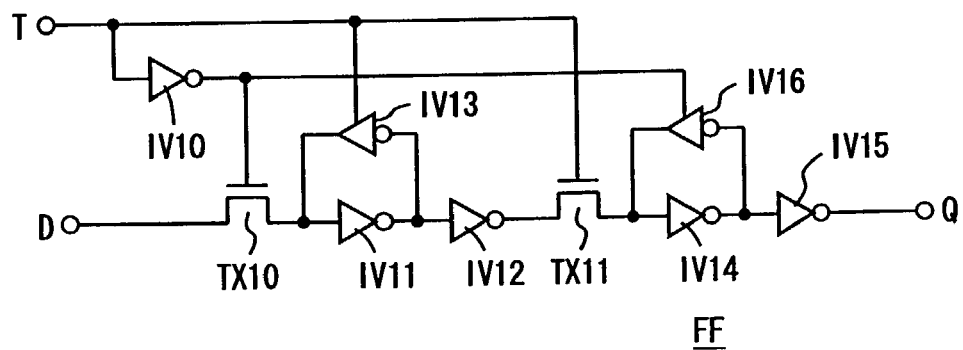
FIG. 33 shows an example of the configuration of a flip-flop shown in FIG. 32.
Figure 34:
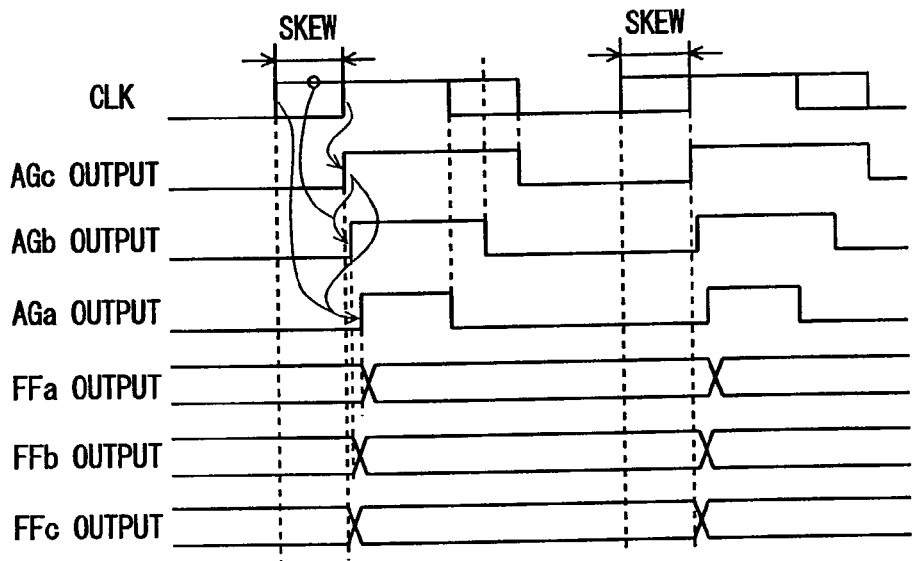
FIG. 34 is a timing chart representing the operations of circuit device shown in FIG. 32.
Figure 35:
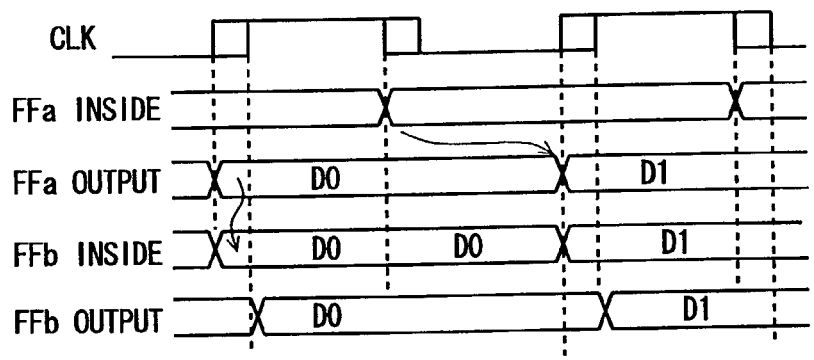
FIG. 35 is a timing chart representing the data transfer and processing operations of the circuit device shown in FIG. 32.

FIG. 12 is a schematic block diagram showing a configuration of a synchronous data transfer and processing device according to the fifth embodiment of the present invention. In FIG. 12, a plurality of cascaded multi-bit transfer circuits 30 are arranged. In FIG. 12, cascaded multi-bit transfer circuits 30a to 30c of three stages are representatively shown. Multi-bit transfer circuit 30a includes flip-flops FFa0 to FFa9 arranged in parallel. Multi-bit transfer circuit 30b includes flip-flops FFb0 to FFb9 arranged in parallel. Multi-bit transfer circuit 30c includes flip-flops FFc0 to FFc9 arranged in parallel. These flip-flops FFa0 to FFa9, FFb0 to FFb9 and FFc0 to FFc9 have the same configuration and, as shown in FIG. 33, each of these flip-flops includes latch circuits cascaded in tow stages. When a control signal applied to a clock input T attains H level, the flip-flop turns into a signal taking in state and takes in a signal applied to an input node D. Then, when the control signal applied to clock input T attains L level, the flip-flop outputs this taken in signal from an output node Q.

Clock control circuits CNTa to CNTc are arranged corresponding to multi-bit transfer circuits 30a to 30c, respectively. Clock control circuit CNTa is arranged for flip-flops FFa0 to FFa9 of multi-bit transfer circuit 30a in common, and is comprised of an AND circuit 35 which receives a corresponding clock signal CLK from a clock distribution circuit 10 and an output control signal from clock control circuit CNTb at the next stage. Likewise, clock control circuit CNTb is comprised of AND gate 35 which receives corresponding clock signal CLK from clock distribution circuit 10 and an output control signal from clock control circuit CNTc at the next stage. Clock control circuit CNTc includes AND circuit 35 which receives corresponding clock signal CLK outputted from clock distribution circuit 10 and an output control signal from a clock control circuit at the next stage, which is not shown.

The output control signal of dock control circuit CNTa is applied to clock input nodes T of flip-flops FFa0 to FFa9 of multi-bit transfer circuit 30a in common through a clock driver 37a. The output control signal of clock control circuit CNTb is applied to dock input nodes T of flip-flops FFb0 to FFb9 of multi-bit transfer circuit 30b in common through a clock driver 37b. The output control signal of clock control circuit CNTc is applied to clock input nodes T of flip-flops FFc0 to FFc9 of multi-bit transfer circuit 30c in common through a clock driver 37c.

Multi-bit transfer circuits 30a to 30c are driven using clock drivers 37a to 37c, respectively. Thus, even if the driving capabilities of clock control circuits CNTa to CNTc are low, it is possible to drive flip-flops FF0 to FF9 (FFa0 to FFa9, FFb0 to FFb9 and FFc0 to FFc9) at high speed using clock drivers 37 (37a to 37c).

With the configurations of clock control circuits CNTa to CNTc shown in FIG. 12, when the output control signals of clock control circuits CNTa to CNTc attains H level, the flip-flops of corresponding multi-bit transfer circuits turn into the latching state and data taken in half a cycle before is outputted. On the other hand, when the output control signals of clock control circuits CNTa to CNTc attains L level, multi-bit transfer circuits 30a to 30c take in the received signals (output data does not change), respectively. With this configuration, when the flip-flops of the multi-bit transfer circuit at the next stage turn into the latching state, AND circuit 35 of the clock control circuit in the preceding stage sets the output control signal at H level in accordance with the state of corresponding clock signal CLK, and the respective flip-flops of corresponding multi-bit transfer circuit 30 (30a, 30b or 30c) are set into the state of outputting new data. Therefore, when the flip-flops of the multi-bit transfer circuit at the next stage turn into the latching state, then the flip-flops in the preceding stage transfer new data, causing no racing problem.

With the configurations of clock control circuits CNTa to CNTc shown in FIG. 12, multi-bit transfer circuits 30a to 30c enter a signal taking in state and latching state in the common phase. Since the output control signal of the clock control circuit provided for the multi-bit transfer circuit at the final stage is sequentially transmitted through a transfer path of a feedback control signal, there is a possibility that an effective clock cycle may be shortened. However, for the configuration in which multi-bit transfer circuits 30a to 30c are cascaded, by arranging the common clock control circuit for a plurality of flip-flops of each respective multi-bit transfer circuit, it is possible to decrease a circuit layout area and to reduce power dissipation.

According to the configuration of the synchronous data transfer and processing device shown in FIG. 12, it suffices that each of flip-flops FFa0 to FFa9, FFb0 to FFb9 and FFc0 to FFc9 turns into a signal taking in state or a latching state in accordance with the control signal applied to clock input node T of the flip-flop. However, the configuration of each flip-flop should not be limited to the configuration in which two latch circuits are provided as shown in FIG. 33. For example, the flip-flop may be configured by cascaded latch circuits of two stages each comprised of cross-coupled NAND gates or NOR gates and transferring complementary data in accordance with control signals.

Furthermore, clock distribution circuit 10 which generates clock signals for data transfer control may be a clock distribution circuit of a different distribution type such as a clock meshed type or fishbone type, beside the clock tree type as already described in the preceding first embodiment.

As stated so far, according to the fifth embodiment of the present invention, one clock control circuit is provided for a multi-bit transfer circuit constituted of a plurality of flip-flops arranged in parallel and this clock control circuit is configured to set a corresponding multi-bit transfer circuit into a state of outputting an output signal (signal taking state) when the multi-bit transfer circuit at the next stage enters the latching state in accordance with a corresponding clock signal from the clock distribution circuit and an output signal of the clock control circuit at the next stage. It is, therefore, possible to easily prevent the occurrence of racing with the reduced number of circuits. In addition, even if the propagation delay on a feedback path of a control signal from each clock control circuit is caused, it is possible to ensure data taking-in/transfer at high speed a clock cycle if the clock cycle is relatively long, or the number of these multi-bit transfer circuits is small and the propagation delay of the feedback control path of this control signal is relatively short.

[Modification]

Figure 13:
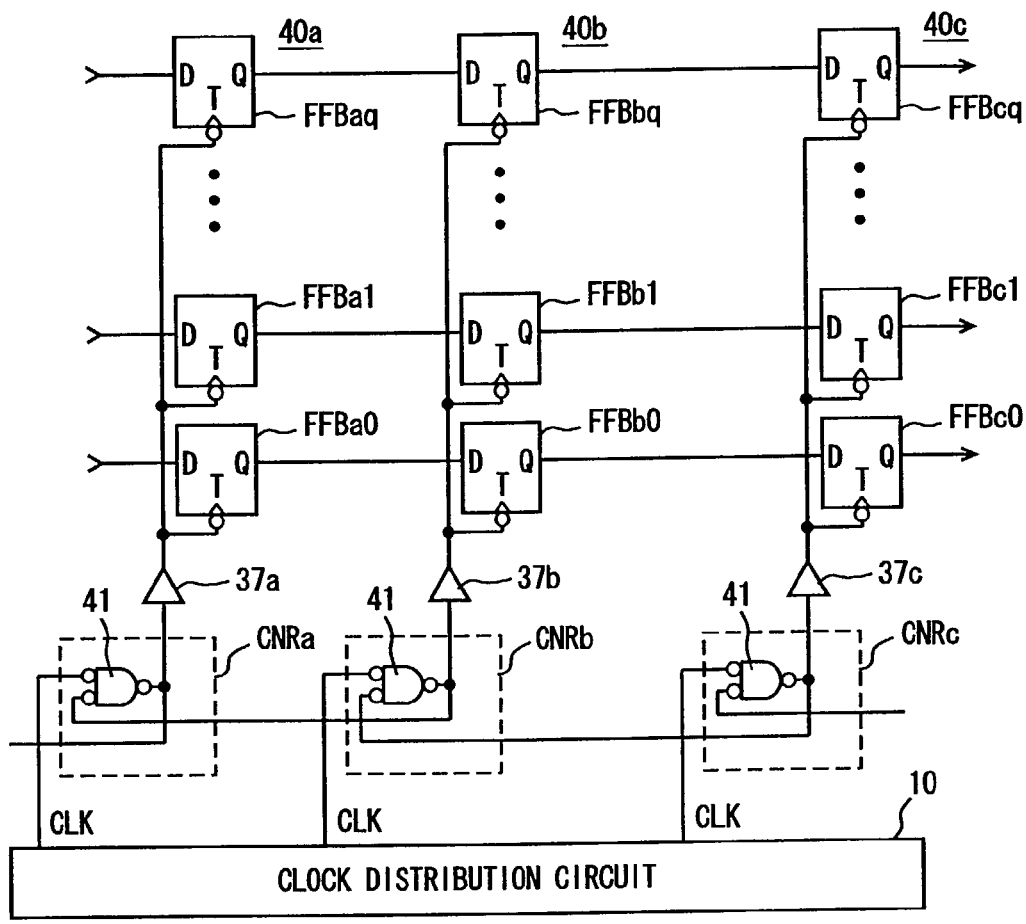
FIG. 13 shows the modification of the fifth embodiment of the present invention.

FIG. 13 is a schematic block diagram showing a construction of the modification of the synchronous data transfer and processing device according to the fifth embodiment of the present invention. In FIG. 13, a plurality of multi-bit data transfer circuits 40 are cascaded. In FIG. 13, cascaded multi-bit transfer circuits 40a to 40c of three stages are representatively shown. Multi-bit transfer circuit 40a includes flip-flops FFBa0 to FFBaq arranged in parallel. Multi-bit transfer circuit 40b includes flip-flops FFBb0 to FFBbq arranged in parallel. Multi-bit transfer circuit 40c includes flip-flops FFBc0 to FFBcq arranged in parallel. When a control signal applied to a clock input node T attains H level, each of flip-flops FFB (FFBa0 to FFBa1, FFBb0 to FFBbq and FFBc0 to FFBcq) takes in data applied to an input node D and an output node Q of the flip-flop enters a latching state. On the other hand, when the control signal applied to clock input T attains L level, each of flip-flops FFB turns into a latching state and data taken in a preceding cycle is transmitted from output node Q. Therefore, these flip-flops FFB operate opposite in phase to flip-flops FF shown in FIG. 12.

Clock control circuits CNRa to CNRc are arranged corresponding to multi-bit transfer circuits 40a to 40c, respectively. Each of clock control circuits CNRa to CNRc is formed of an OR circuit 41. OR circuit 41 of each of clock control circuits CNRa to CNRc receives a corresponding clock signal CLK from a clock distribution circuit 10 and an output control signal from the clock control circuit at the next stage.

The control signals outputted from clock control circuits CNRa to CNRc are transmitted to multi-bit transfer circuits 40a to 40c through clock drivers 37a to 37c, respectively. Specifically, the output signal of clock driver 37a is applied to clock inputs T of respective flip-flops FFBa0 to FFBaq in common. The output signal of clock driver 37b is applied to clock inputs T of respective flip-flops FFBb0 to FFBbq in common. The output signal of clock driver 37c is applied to clock inputs T of respective flip-flops FFBc0 to FFBcq in common.

Figure 14:
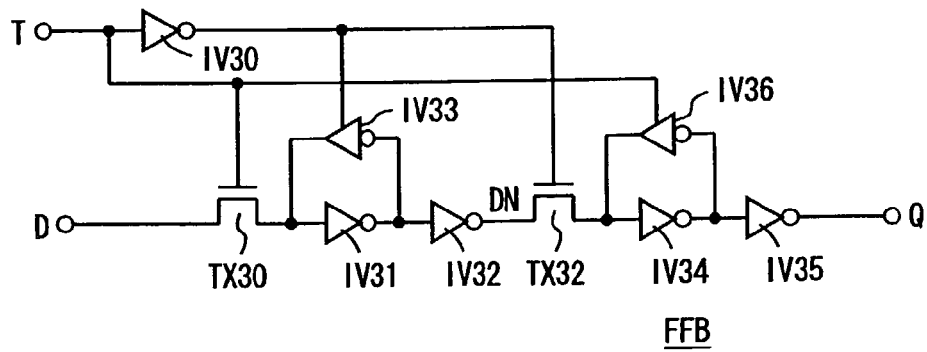
FIG. 14 shows an example of the configuration of a flip-flop shown in FIG. 13.

FIG. 14 is a diagram showing a construction of each of flip-flops FFBa0 to FFBaq, FFBb0 to FFBbq and FFBc0 to FFBcq shown in FIG. 13. Since these flip-flops have the same configuration, FIG. 14 representatively shows flip-flop FFB.

In FIG. 14, flip-flop FFB includes an inverter IV 30 which receives a signal applied to clock input node T, a transfer gate TX30 which is rendered conductive, when the signal at clock input node T is at H level, to pass the signal at input node D, an inverter IV31 which receives the signal transmitted through transfer gate 30, an inverter IV32 which receives the output signal of inverter IV31, and a tri-state inverter buffer IV33 which is made active, when the output signal of inverter IV 30 is at H level, to invert the output signal of inverter IV31 and transmits the inverted output signal to the input of inverter IV30. These transfer gate TX30 and inverters IV31 to IV33 constitute a latch circuit in the first stage.

Flip-flop FFB also includes a transfer gate TX32 which is rendered conductive when the output signal of inverter IV30 is at H level and transmits the output signal of inverter IV32 when made conductive, an inverter IV34 which receives the signal transmitted through transfer gate TX32, an inverter IV35 which inverts the output signal of inverter IV34 and transmits the inverted output signal to output node Q, and a tri-state inverter buffer IV36 which is made active when the signal applied to clock input node T is at H level and inverts the output signal of inverter IV34 and transmits the inverted output signal to the input of inverter IV34 when activated. These transfer gate TX32 and inverters IV34 and IV36 constitute a latch circuit at the second stage.

Figure 15:
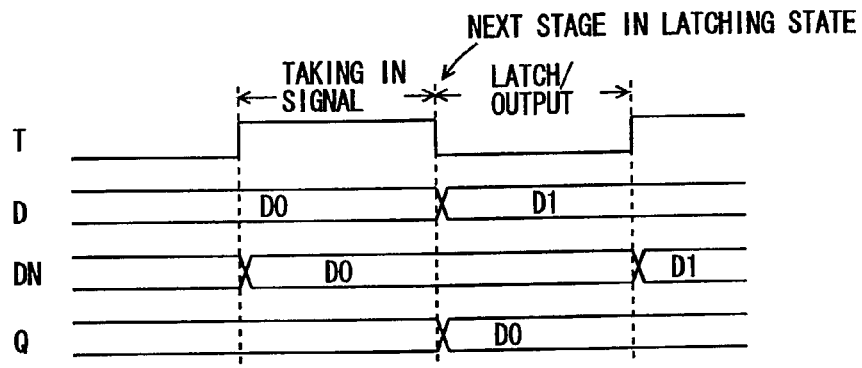
FIG. 15 is a timing chart representing the operation of the flip-flop shown in FIG. 14.

In flip-flop FFB shown in FIG. 14, when the signal applied to clock input node T attains H level as shown in FIG. 15, transfer gate TX30 turns conductive and takes in the data applied to input node D and internal data DN changes according to this taken in signal. At this time, transfer gate TX32 is nonconductive and the data at output node Q does not change.

When the signal applied to clock input node T falls to L level, transfer gate TX30 turns nonconductive and flip-flop FFB enters a latching state. On the other hand, transfer gate TX32 turns conductive and previously taken in data is transmitted to output node Q. Accordingly, in period when the signal applied to clock input node T is at an H level, flip-flop FFB takes in the signal applied to input node D and when the signal applied to clock input node T attains L level, flip-flop FFB enters a latching state and outputs the taken in data.

As shown in FIG. 13C, OR circuit 41 is employed for each of clock control circuits CNRa to CNRc. When the output control signal from the clock control circuit at the next stage attains L level and the flip-flops of the multi-bit transfer circuit at the next stage turn into the latching state, the flip-flops of the multi-bit transfer circuit in the preceding stage are set in the latching state and output new data. It is, therefore, possible to transfer data without causing racing.

In other words, if racing occurs when a signal/data is sequentially transferred at timing delayed by as much as one cycle of clock signal CLK in the flip-flops, each flip-flop FFB transfers new data simply with a delay of a half clock cycle and accurate data transfer cannot be achieved. By detecting that the flip-flop at the next stage turns into a latching state and setting the flip-flops of the corresponding multi-bit transfer circuit in the latching and outputting state using this OR circuit, it is possible to avoid such a racing problem.

As shown in FIG. 13, by arranging one common clock control circuit for a plurality of flip-flops, it is possible to decrease a circuit layout area and to reduce power dissipation, accordingly.

As stated so far, according to the fifth embodiment of the present invention, even if multi-bit transfer circuits transferring multi-bit data are cascaded and each multi-bit transfer circuit are formed of flip-flops, racing can be reliably avoided by detecting that the flip-flops at the next stage turn into the latching state and setting the flip-flops of the corresponding transfer circuit into a latching and data outputting state. Furthermore, by arranging one common clock control circuit for a plurality of flip-flops, it is possible to decrease a circuit layout area and to reduce power dissipation.

It is noted that even with the configuration shown in FIG. 13, there is a possibility that the propagation delay of the control signal feedback path becomes longer. However, if the number of these multi-bit transfer circuits is small and the delay of this propagation path is non-significant, the configuration shown in FIG. 13 is advantageously effective.

Sixth Embodiment

Figure 16:
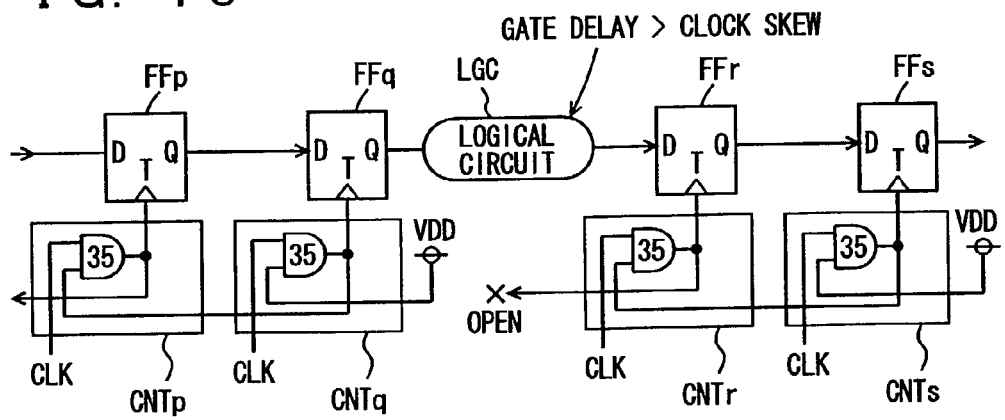
FIG. 16 is a schematic block diagram showing a construction of a synchronous data transfer and processing device according to a sixth embodiment of the present invention.

FIG. 16 is a schematic block diagram of a synchronous data transfer and processing device according to the sixth embodiment of the present invention. In FIG. 16, a logical circuit LGC is interposed between flip-flops FFq and FFr. A flip-flop FFp is arranged in a preceding stage of flip-flop FFq and a flip-flop FFs is arranged at the next stage of flip-flop FFr. when a control signal at a clock input node T attains L level, each of flip-flops FFq to FFs is set in a signal taking in state. When the control signal attains H level, each flip-flop turns into a latching state.

Clock control circuits i to CNTs each formed of an AND gate 35 are arranged corresponding to flip-flops FFq to FFs, respectively.

The gate propagation delay of logical circuit LGC is longer than a clock skew. In this case, flip-flop FFq arranged in the preceding stage of logical circuit LGC can output data synchronously with a corresponding clock signal CLK from a clock distribution circuit irrespectively of the state of flip-flop FFr at the next stage of flip-flop FFq. When the output data of logical circuit LGC attains a valid state at the input of flip-flop FFr, the clock skew is eliminated and flip-flop FFr is already in a latching state.

Therefore, corresponding clock signal CLK and a signal fixed to power supply voltage VDD level are applied to AND circuit 35 of clock control circuit CNTq provided for flip-flop FFq. Clock control circuit CNTq controls the state of flip-flop FFq in accordance with corresponding clock signal CLK from the clock distribution circuit. On the other hand, a control signal outputted from AND circuit 35 of clock control circuit CNTr provided for flip-flop FFr at the next stage is applied to corresponding flip-flop FFr, but a feedback path of this output control signal is set in an open state.

Therefore, if logical circuit LGC is interposed in the configuration of controlling the state of the flip-flop at the preceding stage in accordance with the state of each flip-flop, the feedback path of the control signal is divided at a position at which the logical circuit exists. Thus, the feedback path of the control signal can be shortened to decrease the propagation delay of the control signal. Specifically, if the gate delay of logical circuit LGC is longer than a clock skew, clock control circuit CNTq provided for flip-flop FFq at the preceding controls the operation of flip-flop FFq in accordance with corresponding clock signal CLK, with the simulation that flip-flop FFr at the next stage is always in a latching state. Thus, it is possible to shorten the feedback delay of the control signal, to secure sufficient effective clock cycle time for each flip-flop even with a high-speed clock, and to secure sufficient setup time and hold time for performing data transfer.

AND circuit 35 of clock control circuit CNTp arranged at a preceding stage of clock control circuit CNTq receives corresponding clock signal CLK from the clock distribution circuit and a control signal outputted from clock control circuit CLTq and clock control circuit CNTp controls the operation of corresponding flip-flop FFp.

On the other hand, if flip-flop FFs is the flip-flop at the final stage or a logical circuit having a delay time longer than a clock skew is arranged at the next stage of flip-flop FFs, it is not necessary to consider the state of the flip-flop at the next stage. Therefore, corresponding clock signal CLK from the clock distribution circuit and a power supply voltage VDD are applied to AND gate 35 of clock control circuit CNTs provided for flip-flop FFs (at the final stage) as in the case of the above. Thus, the flip-flop (at the final stage) can output data in accordance with corresponding clock signal CLK from the clock distribution circuit and output definite data at a faster timing without considering the clock skew.

Clock control circuit CNTr arranged for flip-flop FFr at the next stage of logical circuit LGC controls the operation of flip-flop FFr in accordance with a control signal outputted from clock control circuit CNTs at the next stage of clock control circuit CNTr and corresponding clock signal CLK.

[Modification]

Figure 17:
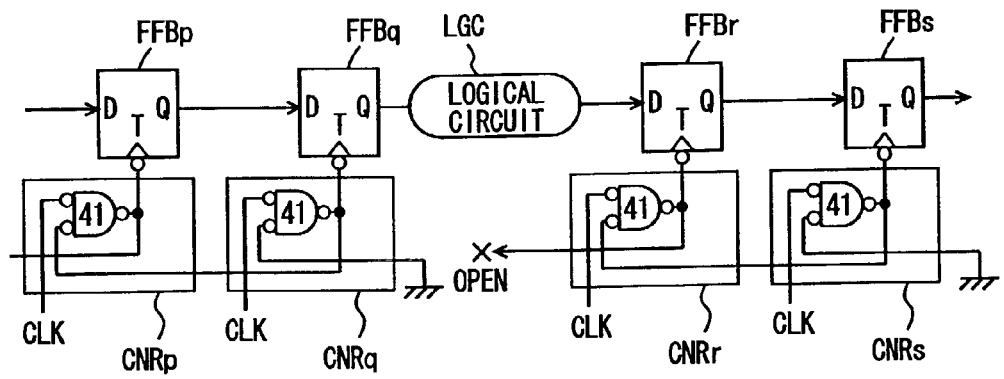
FIG. 17 shows the modification of the sixth embodiment of the present invention.

FIG. 17 is a schematic diagram showing a construction of the modification of the sixth embodiment of the present invention. In FIG. 17, there are provided flip-flops FFBp to FFBs each of which turns into a signal taking in state when a control signal applied to a clock input node T attains H level, outputs new data to an output node Q and turns into a latching state when the control signal applied to clock input node T attains L level.

Clock control circuits CNRp to CNRs each formed of an OR circuit 41 are arranged corresponding to flip-flops FFBp to FFBs, respectively.

A logical circuit LGC is interposed between flip-flops FFBq and FFBr. Logical circuit LGC has gate delay longer than a clock skew as in the case of the configuration shown in FIG. 16. In this case, therefore, flip-flop FFBq provided in a preceding stage of logical circuit LGC is controlled in accordance with corresponding clock signal CLK from the clock distribution circuit irrespectively of the state of flip-flop FFBr at the next stage as in the case of the configuration shown in FIG. 16. Consequently, OR circuit 41 of clock control circuit CNRq arranged for flip-flop FFBq receives corresponding clock signal CLK and a signal fixed to ground voltage level. By the setting of a fed back control signal at this ground voltage level, it is indicated that flip-flop FFBr at the next stage is already in a latching state.

OR circuit 41 of clock control circuit CNRr arranged for flip-flop FFBr arranged at the next stage of logical circuit LGC receives corresponding clock signal CLK from the clock distribution circuit and an output control signal from clock control circuit CNRs at the next stage of clock control circuit CNRr.

If flip-flop FFBs is at the final stage, OR circuit 41 of clock control circuit CNRs provided for flip-flop FFBs receives corresponding clock signal CLK from the clock distribution circuit and a signal fixed to a ground voltage. Therefore, flip-flop FFBs at the final stage turns into a signal taking in state and a latching/outputting state in accordance with corresponding clock signal CLK from the clock distribution circuit.

On the other hand, in clock control circuit CNRp arranged for flip-flop FFBp, OR circuit 41 receives corresponding clock signal CLK from clock distribution circuit and a control signal outputted from clock control circuit CNRq so as to prevent racing in flip-flop FFBq.

If the gate delay of logical circuit LGC is longer than a clock skew, flip-flop FFBq in the preceding stage of logical circuit LGC is allowed to operate synchronously with corresponding clock signal CLK from the clock distribution circuit. Thus, as in the case of the configuration shown in FIG. 16, it is possible to transmit valid data to logical circuit LGC at a faster timing to sufficiently lengthen the processing time period of logical circuit. Further, since a feedback path of the output control signal of clock control circuit CNRr is set in an open state, the feedback path of the output control signal is divided at clock control circuit CNRr in a string of clock control circuits, and a new feedback path is formed starting thereat. It is, therefore, possible to shorten the propagation delay of the control signal feedback path, to prevent an effective clock cycle of each flip-flop from being shortened, to ensure maintaining the hold time and setup time even with a high-speed clock for transferring data.

Figure 36:
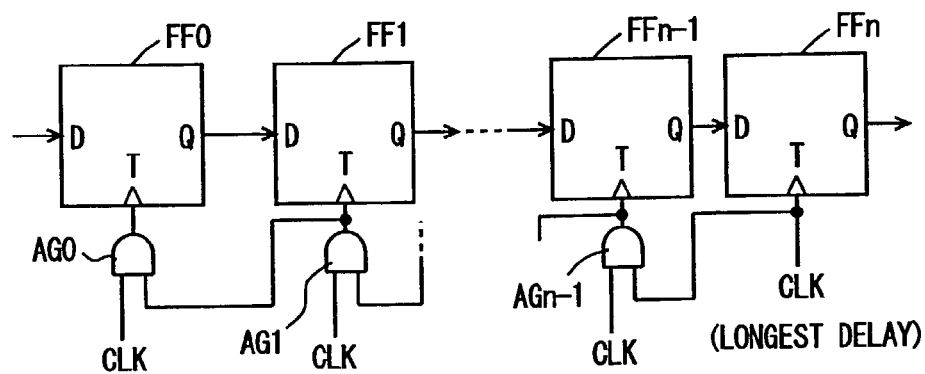
FIG. 36 is a block diagram showing still another configuration of the conventional synchronous data transfer and processing device.
Figure 37:
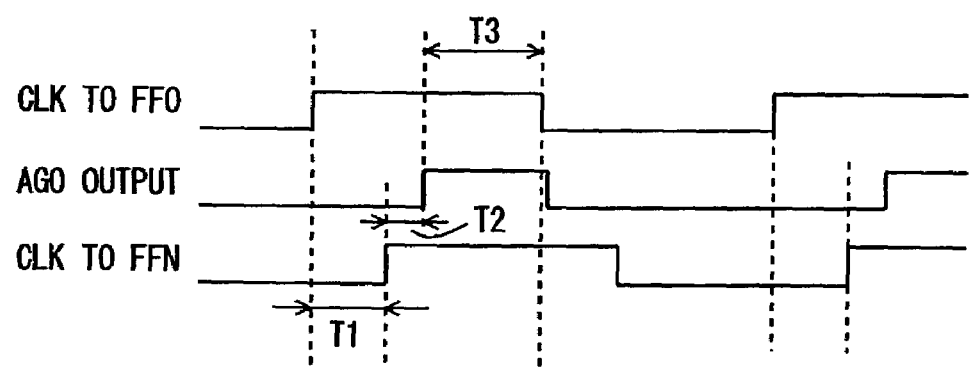
FIG. 37 is a timing chart representing the operations of circuit device shown in FIG. 36.

As stated so far, according to the sixth embodiment of the present invention, where the logical circuit having gate delay longer than a clock skew exists, the flip-flop in the preceding stage of this logical circuit is allowed to operate synchronously with the corresponding clock signal, thereby making it possible to apply valid data to the logical circuit at a faster timing and to sufficiently secure the processing time of the logical circuit. In addition, since the feedback path of the output control signal generated by the clock control circuit provided for the flip-flop arranged at the next stage of the logical circuit is set in an open state, it is possible to shorten the propagation delay of the feedback path of the control signal of the clock control circuit. Thus, the corresponding latch circuit can be reliably kept, for a long period of time, in a latching state to transmit data to the flip-flop at the next stage. In other words, it is possible to sufficiently lengthen a period in which the output of an AND circuit AG0 shown in FIG. 36 is at H level and to ensure transferring data to the flip-flop at the next stage.

Moreover, all the clock control circuits have the same configuration and the logical level of the fed back control signal is simply fixed according to the position at which the logical circuit is interposed. The voltage level of the control signal is fixed by, for example, a mask interconnection. It is, therefore, possible to easily adjust the timing of the control signal outputted from each clock control circuit depending on application.

Seventh Embodiment

Figure 18:
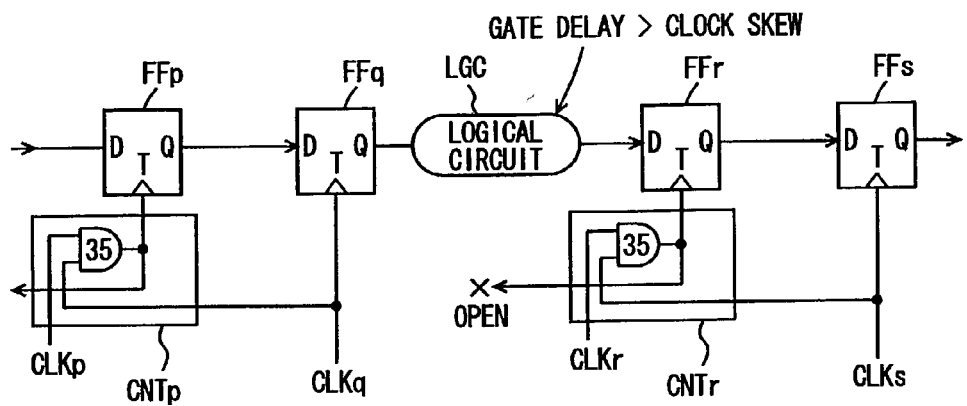
FIG. 18 is a schematic block diagram of a synchronous data transfer and processing device according to a seventh embodiment of the present invention.

FIG. 18 is a schematic block diagram of a synchronous data transfer and processing device according to the seventh embodiment of the present invention. In the synchronous data transfer and processing device shown in FIG. 18, a logical circuit LGC is interposed between flip-flops FFq and FFr. The gate delay of logical circuit LGC is longer than a clock skew. Therefore, irrespectively of the state of flip-flop FFr at the next stage, flip-flop FFq can transmit valid data synchronously with a clock signal without taking into account the clock skew. Therefore, corresponding clock signal CLKq is applied as a control signal to flip-flop FFq from a clock distribution circuit.

If a flip-flop FFs is at the final stage, no flip-flop is provided at the next stage of flip-flop FFs and it is not necessary to consider a racing problem. Therefore, a corresponding clock signal CLKs is applied to the clock input node T of flip-flop FFs as a control signal from the clock distribution circuit. It is noted that a logical circuit having long gate delay may be provided at the next stage of flip-flop FFs.

A clock control circuit CTNp for flip-flop FFp arranged in the preceding stage of flip-flop FFq receives clock signal CLKq applied to flip-flop FFq and a corresponding clock signal CLKs from the clock distribution circuit. Therefore, flip-flop FFp outputs valid data after flip-flop FFq turns into a latching state.

Likewise, AND circuit 35 of a clock control circuit CNTr arranged for flip-flop FFr at the next stage of logical circuit LGC receives a corresponding clock signal CLKr from the clock distribution circuit and clock signal CLKs to flip-flop FFs at the next stage of flip-flop FFr. Therefore, clock control circuit CNTr for flip-flop FFr outputs valid data after flip-flop FFs at the next stage turns into a latching state. A feedback path of a control signal outputted from clock control circuit CNTr is set in an open state.

Figure 19:
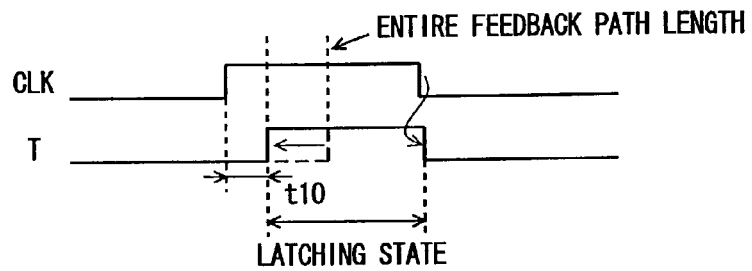
FIG. 19 is a timing chart representing the operation of a clock control circuit shown in FIG. 18.

In the configuration shown in FIG. 18, the feedback path of the control signal is divided as in the case of the preceding sixth embodiment. It is, therefore, possible to shorten the propagation delay time of the feedback control signal. As a result, as shown in FIG. 19, it is possible to shorten delay time t10, due to the feedback delay of the control signal, after corresponding clock signal CLK rises to H level until the control signal at clock input node T rises to H level. It becomes possible to increase the time period in which the control signal at the clock input node T of a corresponding flip-flop is at an H level sufficiently, to ensure transferring data from the flip-flop to a flip-flop at the next stage.

Furthermore, according to the configuration shown in FIG. 18, clock signals (CLKq and CLKs) from the clock distribution circuit are simply applied to flip-flops FFq and FFs for which there is no need to consider the states of the flip-flops at the respective next stages. Thus, it becomes possible to decrease the number of components of each clock control circuit.

[Modification]

Figure 20:
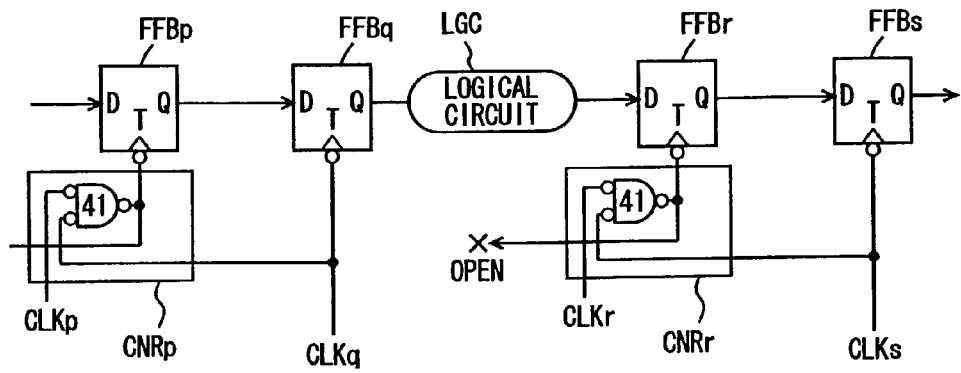
FIG. 20 shows the modification of the seventh embodiment of the present invention.

FIG. 20 is a schematic diagram showing a construction of the modification of the seventh embodiment of the present invention. In FIG. 20, there are employed flip-flops FFBp to FFBs, each of which turns into a signal taking in state when a control signal applied to a clock input node T attains H level and turns into a latching state when the control signal applied to clock input node T attains L level. A logical circuit LGC is interposed between flip-flops FFBq and FFBr.

As in the configuration shown in FIG. 18, logical circuit LGC has gate propagation delay longer than a clock skew. Therefore, a corresponding clock signal CLKq is directly applied from a clock distribution circuit to clock input node T of flip-flop FFBq arranged at the preceding stage of logical circuit LGC. Clock signals CLKp and CLKw from the clock distribution circuit are applied to a clock control circuit CNRp arranged for flip-flop FFBp provided at the preceding stage of flip-flop FFBq. Therefore, the NOR gate 41 of clock control circuit CNRp outputs a taken-in signal when flip-flop FFBq at the next stage turns into a latching state.

A corresponding clock signal CLKs from the clock distribution circuit is directly applied to, for example, flip-flop FFBs at the final stage for which there is no need to consider the state of the flip-flop at the next stage. A clock control circuit CNRr provided for flip-flop FFBr at the next stage of logical circuit LGC controls the state of flip-flop FFBr in accordance with a corresponding clock signal CLKr from the clock distribution circuit and clock signal CLKs for flip-flop FFBs at the next stage. That is, in this clock control circuit CNRr, an OR gate 41 receives clock signals CLKr and CLKs. Since there is no need to feed back an output control signal from clock control circuit CNRr to the flip-flop at the preceding stage, a feedback path for the control signal is set in an open state.

According to the configuration shown in FIG. 20 as in the above, therefore, the feedback path of the control signal is divided at a position at which logical circuit LGC is interposed. As a result, the delay time of the control signal transmitted through the feedback path in each clock control circuit is shortened since the length of the feedback path is shortened and, as in the case of the configuration shown in FIG. 18, it is possible to make sufficiently longer the period in which the control signal is at L level in each of flip-flops, to set the corresponding flip-flop in a latching state for a sufficiently long period and to accurately transfer taken in data to the flip-flop at the next stage.

In FIGS. 18 and 20, description is given with the assumption that flip-flops FFs and FFBs are flip-flops at final stages. However, a logical circuit having longer gate delay than a clock skew may be arranged at the next stage of flip-flop FFs or FFBs.

As stated so far, according to the seventh embodiment of the present invention, where the logical circuit having the gate delay longer than the clock skew is arranged or the flip-flop is at the final stage and does not require consideration of the clock skew, a clock signal from the clock distribution circuit is directly applied to the flip-flop of interest. It is, therefore, possible to decrease the number of components of the clock control circuits, to decrease a layout area and to reduce power dissipation. Furthermore, according to the configuration of each flip-flop, since the feedback path of the control signal is divided, it is possible to shorten the feedback delay time of the output control signal, to ensure reliable data transfer to prevent the malfunction of the flip-flops. In addition, the clock signal from the clock distribution circuit is directly applied to the flip-flop at the preceding stage of the logical circuit and the flip-flop at the final stage. It is, therefore, possible to decrease the number of components of the clock control circuits to reduce a layout area and power dissipation of the clock control circuits.

Eighth Embodiment

Figure 21:
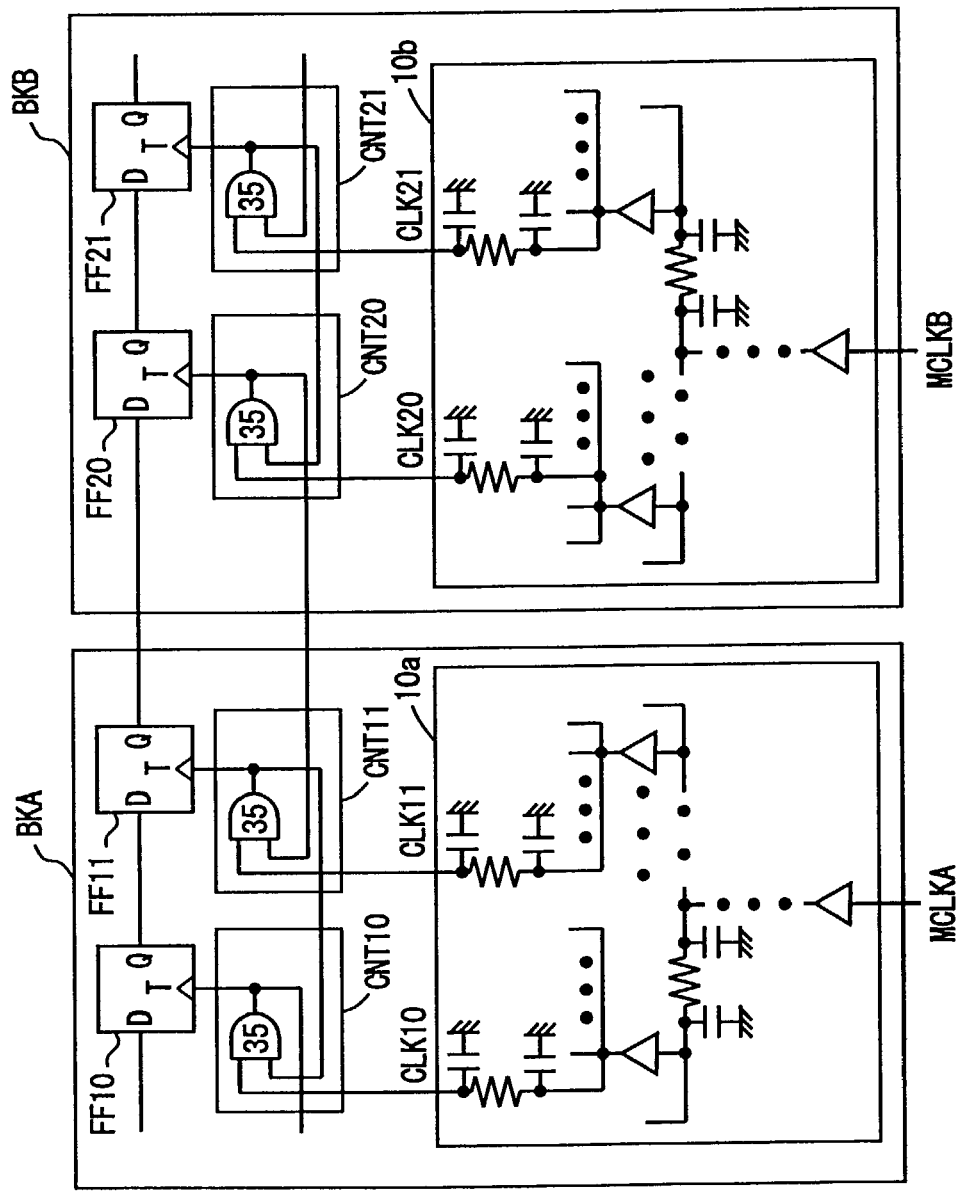
FIG. 21 is a schematic block diagram showing a construction of a synchronous data transfer and processing device according to an eighth embodiment of the present invention.

FIG. 21 is a schematic diagram showing a construction of a synchronous data transfer and processing device according to an eighth embodiment of the present invention. In FIG. 21, two functional blocks BKA and BKB are cascaded. In functional block BKA, a clock distribution circuit 10a that generates an internal clock signal in accordance with a master clock signal MCLKA is arranged. Likewise, in functional block BKB, a clock distribution circuit 10b that generates an internal clock signal in accordance with a master clock signal MCLKB is arranged.

In functional block BKA, flip-flops FF10 and FF11 are cascaded in the data output stage thereof. Clock control circuits CNT10 and CNT11 are arranged corresponding to flip-flops FF10 and FF11, respectively. Clock control circuits CNT10 and CNT11 receive internal clock signals CLK10 and CLK11 from corresponding clock distribution circuit 10a and also receive control signals outputted from the clock control circuits at the next stages of these circuits CNT10 and CNT11, respectively.

Likewise, in functional block BKB, two flip-flops FF20 and FF21 are cascaded in the data input stage thereof. Clock control circuits CNT20 and CNT21 are arranged corresponding to flip-flops FF20 and FF21, respectively. Clock control circuit CNT20 receives a corresponding clock signal CLK20 from corresponding clock distribution circuit 10b and a control signal outputted from a clock control circuit CNT21 at the next stage. Clock control circuit CNT21 receives a corresponding clock signal CLK21 from clock distribution circuit 10b and a control signal outputted from a clock control circuit at a not shown next stage.

Each of flip-flops FF10, FF11, FF20 and FF21 turns into a latching state when a control signal applied to a clock input node T attains H level. Each of clock control circuits CNT10, CNT11, CNT20 and CNT21 for these flip-flops is formed of an AND circuit 35.

In the case of, for example, a cell-based semiconductor integrated circuit device, macro cells each having an internal configuration stored as a library are used. If the clock distribution circuit is included in such a macro cell, internal clock signals are generated by the clock distribution circuits in the respective macro cells through different paths. As shown in FIG. 21, therefore, if internal clock signals are generated by clock distribution circuits 10a and 10b in functional blocks BKA and BKB, respectively, it is possible to reduce the clock skew between the internal clock signals generated by clock distribution circuit 10a and the clock skew between the internal clock signals generated by clock distribution circuit 10b. However, clock distribution circuits 10a and 10b individually and independently form internal clock signals through separate paths, and there is no symmetry in the arrangement for compensating for clock signal propagation delay between the clock distribution circuits 10a and 10b. Therefore, the skew between the internal clock signals generated by clock distribution circuits 10a and 10b would be increased.

Where the internal clock signals are formed in the functional blocks BKA and BKB through separate paths, between flip-flops FF11 and FF20 arranged in the boundary region of the functional blocks, detection is made that flip-flop FF20 at the first stage of functional block BKB turns into a latching state, and then new data is transferred from flip-flop FF 11 at the final stage of functional block BKA to the first stage flip-flop FF20. Therefore, clock control circuit CNT11 receives clock control signal CLK11 outputted from clock distribution circuit 10a as well as the control signal outputted from clock control circuit CNT20, and controls the operation of flip-flop FF11. Thus, data can be transferred accurately even if a clock skew between the functional blocks is relatively large.

Specifically, clock control circuit CTN11 at the final stage of functional block BKA detects that flip-flop FF20 at the first stage of functional block BKB turns into a latching state in response to the H level of the control signal outputted from associated clock control circuit CNT20, sets the output control signal thereof at H level in accordance with internal clock signal CLK11 and causes flip-flop FF11 to transfer new data. With this configuration, even if data transfer time required for transferring data from flip-flop FF11 at the final stage of functional block BKA to flip-flop FF20 at the first stage of functional block is shorter than a clock skew between the functional blocks, data can be reliably transferred between the functional blocks.

[Modification]

Figure 22:
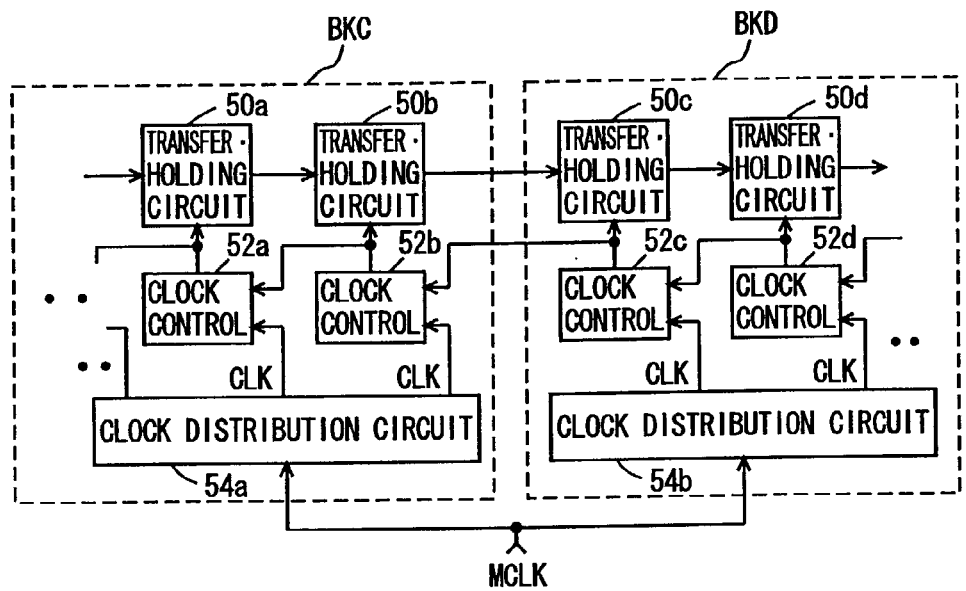
FIG. 22 shows the modification of the eighth embodiment of the present invention.

FIG. 22 is a schematic block diagram showing a construction of the modification of the eighth embodiment of the present invention. In FIG. 22, two functional blocks BKC and BKD are arranged in a cascaded fashion. In functional block BKC, a clock distribution circuit 54a that generates an internal clock signal in accordance with a master clock signal MCLK is arranged. In functional block BKD, a clock distribution circuit 54d that generates an internal clock signal of functional block BKD in accordance with master clock signal MCLK is arranged.

In functional block BKC, cascaded transfer/holding circuits 50a and 50b of two stages are arranged in the output stage thereof. In functional block BKD, cascaded transfer/holding circuits 50c and 50d of two stages are arranged in the input stage thereof. Each of transfer/holding circuits 50a to 50d may be formed of a latch circuit which turns into a latching state/transparent state in accordance with a control signal applied to a clock input node thereof, or may be formed of a flip-flop which turns into a latching state when a control signal applied to the clock input node thereof attains L level. Alternatively, each of transfer/holding circuits 50a to 50d may be formed of a flip-flop including cross-coupled type latch circuits transferring complementary data, or may be formed of a latch circuit having cross-coupled gate circuits.

Clock control circuits 52a to 52d are arranged corresponding to transfer/holding circuits 50a to 50d, respectively. Clock control circuits 52a and 52b receive corresponding clock signals CLK from a clock distribution circuit 54a, respectively. Clock control circuit 52c and 52d receive corresponding internal clock signals CLK from a corresponding clock distribution circuit 54b, respectively.

Each of clock distribution circuits 54a and 54b has a clock tree type, clock mesh type or fishbone type circuit configuration. Therefore, the internal clock signals generated by each of clock distribution circuits 54a and 54b have relatively small skews. However, since clock distribution circuits 54a and 54b generate the internal clock signals individually and independently of each other through separate paths, a skew between the internal clock signals generated by clock distribution circuits 54a and 54b would be relatively large.

Each of clock control circuits 52a to 52d receives a control signal outputted from the clock control circuit at the next stage as a fed back control signal.

As shown in FIG. 22, if internal clock signals are generated in accordance with clock distribution circuits 54a and 54b respectively in functional blocks BKC and BKD in accordance with same master clock signal, a clock skew would be increased in the boundary region between functional blocks BKC and BKD due to the difference in the propagation delay of master clock signal MCLK between clock distribution circuits 54a and 54b as well as the asymmetric arrangement of clock distribution circuits 54a and 54b. Therefore, transfer/holding circuit 50b arranged in this boundary region receives not only clock signal CLK from clock distribution circuit 54a but also a control signal outputted from clock control circuit 52c, and detects the state of the associated transfer/holding circuit 50c arranged in the first input stage of functional block BKD.

In the configuration in which internal clock signals are generated in functional blocks BKC and BKD through clock distribution circuits 54a and 54b, respectively, using common master clock signal MCLK, the control signal for each flip-flop is fed back to the clock control circuit at the preceding stage even in this functional block boundary region. Thus, data can be accurately transferred between the functional blocks.

It is noted that each of functional blocks BKC and BKD in the configuration shown in FIG. 22 may employ the configurations as shown in the first to seventh embodiments.

As stated so far, according to the eighth embodiment of the present invention, a plurality of functional blocks generating internal clock signals through separate paths are arranged, the state of the transfer/holding circuit at the input first stage of the functional block in a subsequent stage is detected in the boundary region between the functional blocks and the data of the transfer/holding circuit at the final output stage of the functional block in the preceding stage is transferred in accordance with the result of detection. It is, therefore, possible to accurately transfer data between the functional blocks even if the internal clock signals are generated through separate paths individually.

It is noted that each of functional blocks BKC and BKD is merely required to implement one processing function. Functional blocks BKC and BKD are merely required to be divided in accordance with the clock distribution circuits, respectively. The functions of the logical circuits interposed internally should not be limited, and these functional blocks may be transfer paths transferring data synchronously with clock signals.

By feeding back and utilizing the control signal for the transfer/holding circuit such as a flip-flop at the subsequent stage in the block boundary region, as a control signal to the transfer/holding circuit such as a flip-flop at the final output stage of the preceding block, it is possible to accurately transfer data between the blocks. In addition, even when timing is changed based on a timing verification result, the hold time is always satisfied because the setup time is always secured, and no hold time violation occurs. Therefore, even when the system is expanded, it suffices to verify only the setup condition. Further, a delay circuit for avoiding racing is not employed, and timing verification can be easily performed.

Ninth Embodiment

Figure 23:
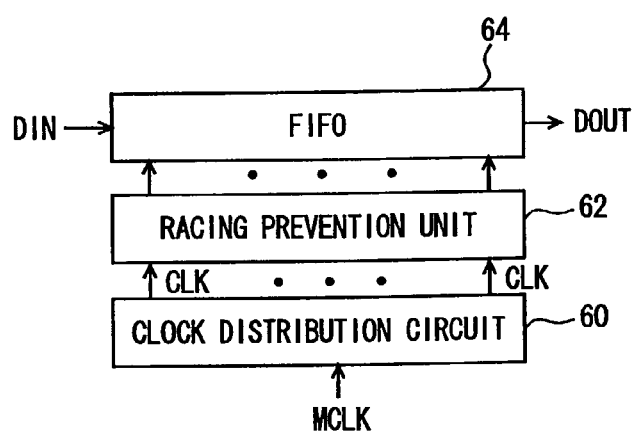
FIG. 23 is a schematic block diagram showing a construction of a synchronous data transfer and processing device according to a ninth embodiment of the present invention.

FIG. 23 is a schematic block diagram showing a construction of a synchronous data transfer and processing device according to the ninth embodiment of the present invention. In FIG. 23, the synchronous data transfer and processing device includes a clock distribution circuit 60 which distributes a master clock signal, and a racing prevention unit 62 which controls the transfer operation of each stage of a FIFO (first-in, first-out) 64 in accordance with an internal clock signal CLK outputted from clock distribution circuit 60. Racing prevention unit 62 includes clock control circuits arranged corresponding to the respective stages of FIFO 65. When the output signal of the clock control circuit at the next stage instructs a latching state, data is outputted from the corresponding stage to the next stage under the control of the racing prevention unit 62.

FIFO 64 is formed of a plurality of cascaded transfer/holding circuits, and includes latch circuits or flip-flops as the components thereof Racing prevention unit 62 controls the transfer/holding circuits formed of latch circuits or flip-flops in the respective stages of FIFO 64 in accordance with the states of the transfer/holding circuits at the next stages, respectively. Thus, it is possible to reliably prevent racing, to sequentially, accurately transfer received data DIN for sequentially outputting data DOUT in the taking-in order. Accordingly, if FIFO 64 is formed of transfer/holding circuits and performs transfer operation in response to clock signal CLK, racing prevention unit 62 including the clock control circuits described in the preceding first to eighth embodiments is configured to control the data transfer operation of FIFO 64. Thus, data can be accurately transferred in accordance with a high-speed clock without causing racing. Furthermore, even if FIFO 64 is employed as a buffer memory, it is possible to accurately perform buffering and achieve the first-in and first-out of data.

[First Modification]

Figure 24:
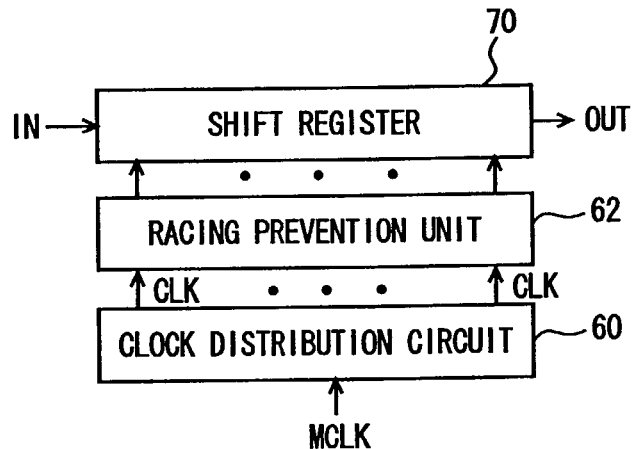
FIG. 24 is a schematic block diagram of the first modification of the ninth embodiment of the present invention.

FIG. 24 is a schematic block diagram showing a construction of the first modification of the ninth embodiment of the present invention. In FIG. 24, the synchronous data transfer and processing device includes a shift register 70 which transfers an input signal IN synchronously with a clock signal received from a clock distribution circuit 60. Shift register 70 includes a plurality of cascaded register stages. A racing prevention unit 62 is provided for preventing racing in data transfer between the register stages. In racing prevention unit 62, clock control circuits shown in the preceding first to eighth embodiments are arranged corresponding to the respective register stages depending on the internal configuration of shift register 70.

Shift register 70 sequentially transfers data/signal synchronously with a clock signal CLK. Therefore, if racing occurs in high-speed data transfer, accurate shift operation cannot be performed, and a circuit receiving the output data OUT of shift register 79 would malfunction. However, by arranging racing prevention unit 62 including the clock control circuits described in the first to eighth embodiments, it is possible to prevent racing between the register stages, and data can be accurately transferred.

[Second Modification]

Figure 25:
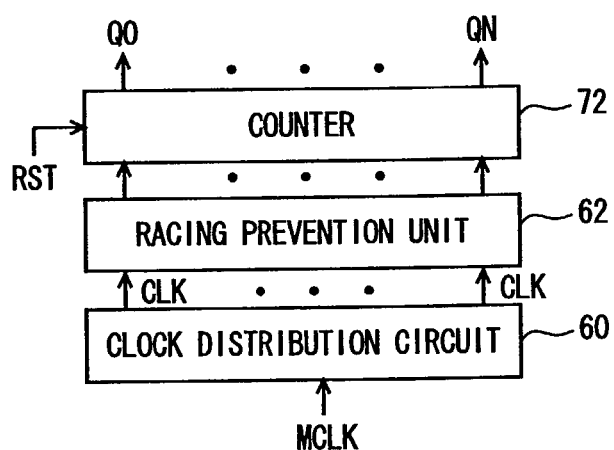
FIG. 25 is a schematic block diagram of the second modification of the ninth embodiment of the present invention.

FIG. 25 is a schematic block diagram showing a construction of the second modification of the ninth embodiment of the present invention. In FIG. 25, the synchronous data transfer and processing device includes a counter 72 which performs a counting operation synchronously with a clock signal CLK outputted from a clock distribution circuit 60. Counter 72 includes latch circuits or flip-flops corresponding to count bits Q0 to QN, respectively, and is a clock synchronous counter which takes in the output data of a preceding stage and generates a count value. The initial value of counter 72 is set in accordance with a reset signal RST.

According to the configuration of clock synchronous counter 72, since the respective counting stages of the counter performs a transfer operation in synchronization with the clock signal CLK, and a racing prevention unit 62 is provided, as in the case of the first to ninth embodiments, to allow the respective counting stages to transfer data, achieving accurate counting operation.

It is noted that the configuration of counter 72 can be any of a synchronous counting circuit configured such that each counting stage takes in the output count value of the counting stage at the preceding stage synchronously with the clock signal.

[Third Modification]

Figure 26:
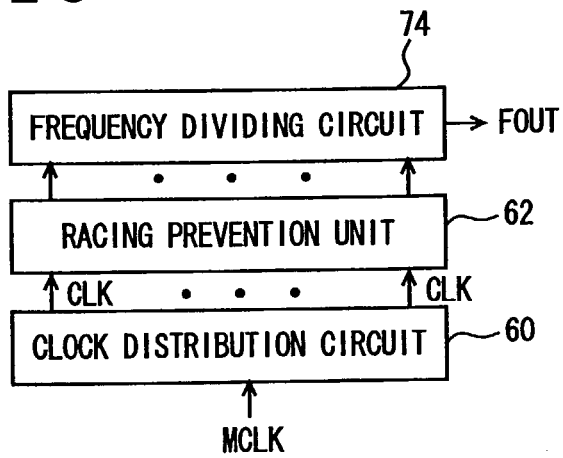
FIG. 26 is a schematic block diagram showing a construction of the third modification of the ninth embodiment of the present invention.

FIG. 26 is a schematic block diagram showing a construction of the third modification of the ninth embodiment of the present invention. In FIG. 26, a frequency dividing circuit 74 which divides in frequency a clock signal CLK and generates a frequency-divided clock signal FOUT is provided. Frequency dividing circuit 74 has the same configuration as that of the counter, includes a plurality of transfer/holding circuits (latch circuits or flip-flops) each transferring a signal synchronously with the clock signal of clock distribution circuit 60, transfers a signal synchronously with internal clock signal CLK under the control of an racing prevention unit 62, and generates a frequency-divided signal FOUT of internal clock signal CLK.

In frequency-dividing circuit 74⊙ stated above, a plurality of transfer/holding circuits are arranged and the transfer/holding circuits sequentially perform the transfer operation in accordance with clock signal CLK to frequency-divide internal clock signal CLK. In frequency-dividing circuit 74, where there is arranged a logical circuit which feeds back output signal FOUT to an input stage or a logical circuit at an intermediate stage for receiving a feedback signal, transfer/latch operation is performed synchronously with clock signal CLK under the control of the racing prevention unit 62, the clock signal CLK can be accurately frequency-divided at a predetermined division ratio. Accordingly, even if clock signal CLK is a high-speed clock signal and the cock cycle thereof is short, it is possible to reliably prevent racing to generate an accurate frequency-divided signal by using racing prevention unit 62.

[Fourth Modification]

Figure 27A:
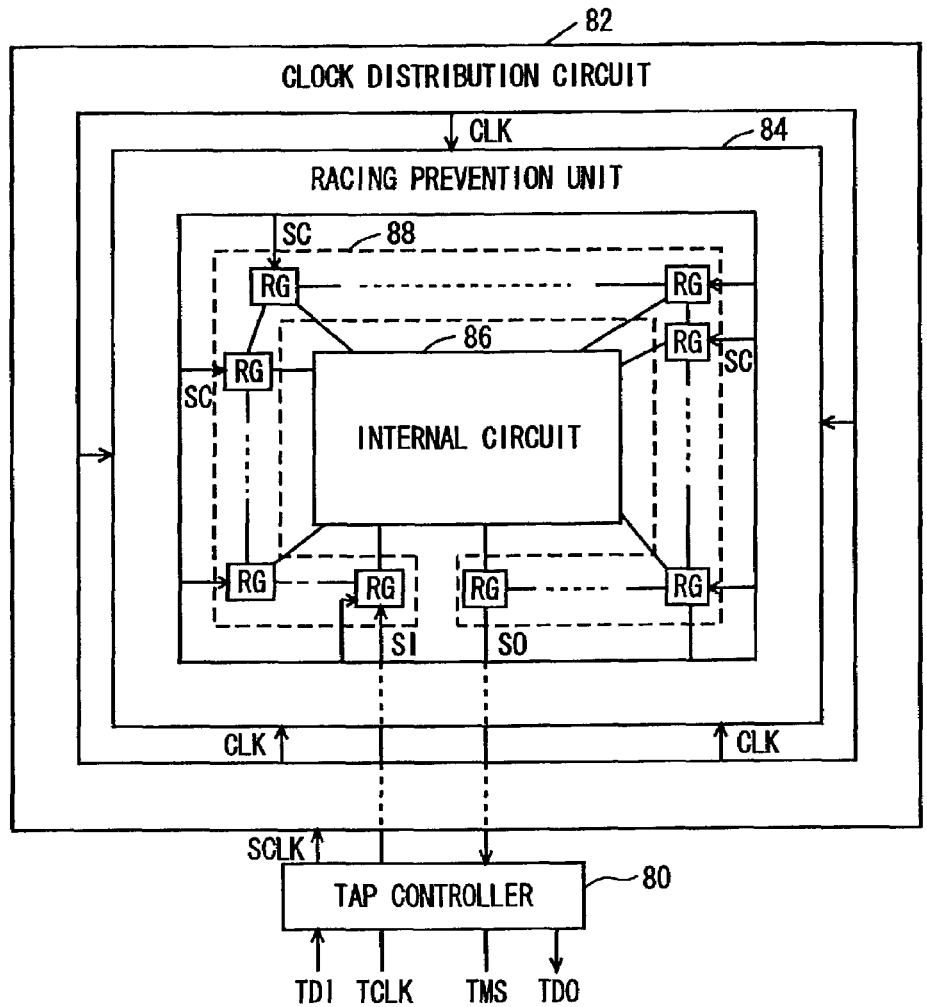
FIG. 27A is a schematic block diagram of the fourth modification of the ninth embodiment of the present invention.

FIG. 27A is a schematic block diagram showing a construction of the fourth modification of the ninth embodiment of the present invention. In FIG. 27A, register circuits RG are arranged corresponding to the input/output terminals of an internal circuit 86, respectively. Register circuits RG constitute a scan path 88 which serially transfers data. Each register circuit RG is, for example, a boundary scan register that is standardized by JTAG (Joint Test Action Group). Register circuits RG are arranged between internal circuit 86 and the input and output terminals, and in a test mode operation, isolate internal circuit 86 from the input and output terminals, serially transfer test data SI applied from a TAP controller 80 to set the internal nodes of internal circuit 86 in predetermined states. In addition, register circuits RG capture the operation state of internal circuit 86, transfer captured data serially and output the data as test data TDO through TAP (test access port) controller 80.

In a normal operation mode, each register circuit RG on scan path 88 connects the input or output terminal to the corresponding node of internal circuit 86.

By arranging scan path 88, it is possible to detect the internal states of the circuit externally and to execute an accurate test even after board mounting.

On scan path 88, each register circuit RG connects an external terminal to internal circuit 86 and allows internal circuit 86 to operate in accordance with an external signal in the normal operation mode. In a test mode, internal circuit 86 is isolated from the external signal input and output terminals by this scan path 88. By allowing internal circuit 86 to operate in accordance with signal/data set in each register RG and by transferring an operation result externally through register circuit RG on scan path 88, it is possible to detect the operation status of internal circuit 86 externally.

When data is transferred through scan path 88, TAP controller 80 controls the transfer operations of the register circuits. TAP controller 80 receives external test data TDI, a test clock signal TCLK and a test instruction TMS and generates an internal control signal for performing the designated operation. Typical operation states controlled by TAP controller 80 include a capture state for capturing applied data, a shift state for transferring captured data and an update state for updating the storage content of each register circuit RG on scan path 88.

A shift clock SCLK in the shift operation is applied from TAP controller 80 to a racing prevention unit 84 through a clock distribution circuit 82. Racing prevention unit 84 includes clock control circuits arranged corresponding to register circuits RG on scan path 88, respectively, ensures accurate transfer operation when each register circuit RG transfers data/signal and thereby ensures an accurate test.

Figure 27B:
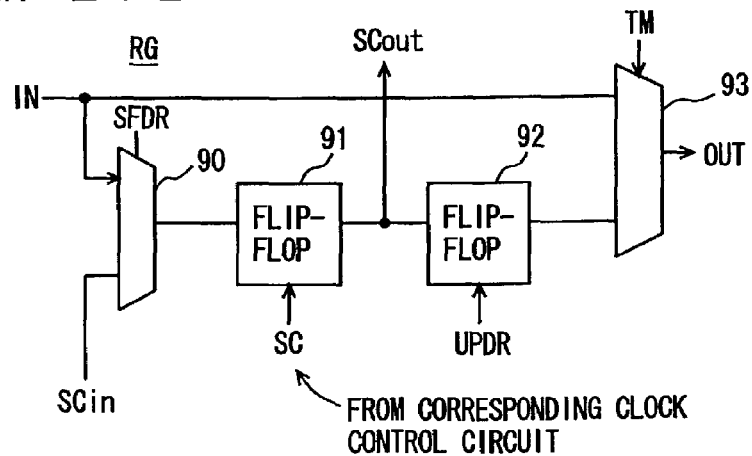
FIG. 27B shows an example of the configuration of a register circuit shown in FIG. 27A.

FIG. 27B is a schematic block diagram showing an example of a construction of register circuit RG. In FIG. 27B, register circuit RG includes a selector 90 which selects one of a normal signal IN applied to an input node and a signal SCin from the register circuit at a preceding stage in accordance wit a shift instruction SFDR, a flip-flop 91 which stores data/signal applied from selector 90 in accordance with shift clock signal SC, a flip-flop 92 which takes in and latches the output data/signal of flip-flop 91 in accordance with an update instruction UPDR, and a selector 93 which selects one of normal signal IN at the input node and the latched data/signal of flip-flop 92.

If register circuit RG is provided for the input terminal, input signal IN is a signal applied externally to the input terminal and output data/signal OUT of selector 93 is applied to internal circuit 86. On the other hand, if register RG is provided for the output terminal, input signal IN is an output data/signal of internal circuit 86 and output data/signal OUT of selector 93 is applied to the output terminal.

In the configuration of register circuit RG shown in FIG. 27B, the data/signal is sequentially transferred through flip-flop 91. Shift clock signal SC applied to flip-flop 91 is generated by the corresponding clock control circuit in accordance with clock signal CLK applied from clock distribution circuit 82 and shift clock signal SC applied to register circuit RG at the next stage. The clock control circuit included in racing prevention unit 84 adjusts the data output timing of flip-flop 91 according to shift clock signal SC, it is possible to accurately transmit the data/signal through scan path 88.

Flip-flop 92 simply latches the output data of flip-flop 91 at the preceding stage in accordance with update clock UPDR. In this case, the state of flip-flop 91 is made definite and there is no need to provide a clock control circuit for update clock UPDR.

On scan path 88, boundary scan registers conforming to the JTAG are employed. However, a scan path configured to transfer the data/signal at the internal nodes of internal circuit 86 may be included in scan path 88, and register circuits RG should not be limited to the boundary scan registers conforming to the JTAG. It suffices that the scan path allows accessing the internal nodes externally for setting the internal nodes in observable states externally. If the scan path for sequentially transferring data/signal in accordance with shift clock signal is constructed, it is possible to transfer data/signal at high speed accurately by using racing prevention unit 84. If the scan path is long, in particular, it is possible to accurately transfer data/signal by utilizing racing prevention unit 84.

Furthermore, flip-flops 91 and 92 are employed in register circuit RG shown in FIG. 27B. Alternatively, a normal lath circuit which turns into transparent state/latching state may be used for flip-flops 91 and 92.

Moreover, the clock distribution circuit may not be arranged in each of the specific configurations shown in the ninth embodiment of the present invention. A configuration in which each data transfer/holding circuit operates in accordance with an internal clock signal from one clock driver may be used.

As stated so far, according to the ninth embodiment of the present invention, data/signal is transferred to a circuit device which performs counting operation, frequency-dividing operation or transfer operation in accordance with the clock signal at the next stage, conditioned that the circuit device at the next stage is in latching states. It is possible to prevent racing to ensure an accurate operation in these circuit devices. Further, on the scan path as well, it is possible to accurately transfer test data and to accurately perform a test.

Furthermore, these circuit devices are each a device which can perform a desired processing with a logical circuit provided between latch circuits or flip-flops. According to the configuration in which the boundary scan registers are arranged to surround each functional block between the functional blocks, it is possible to accurately transfer data/signal between the functional blocks through the scan register circuits.

In the configuration shown in FIG. 27A, TAP controller 80 generates shift clock signal SCLK in accordance with test clock signal TCLK and applies the generated signal to clock distribution circuit 82, and internal clock signal CLK is generated by clock distribution circuit 82 and applied to racing prevention unit 84. Shift clock SC is applied from racing prevention unit 84 to register circuits RG in accordance with this internal clock signal and the states of register circuits in the preceding stages of the respective register circuits RG. This clock distribution circuit may be the clock meshed type clock distribution circuit, the fishbone type clock distribution circuit or the clock tree type clock distribution circuit, or may be simply constituted of a clock transmission line arranged in the form of a loop.

As stated so far, according to the present invention, the latching state of a transfer/holding circuit at the next stage is detected and the transfer of data/signal to the circuit at the next stage is permitted in accordance with the detection result, and therefore, data/signal is reliable transferred while preventing occurrence of racing. In addition, since there is no need to arrange a delay circuit for avoiding racing, the holding violation of the hold time shortage caused by racing does not occur (this is because if the setup time is secured, the hold time is secured), thereby facilitating timing verification. Moreover, since no delay circuit is employed, it is possible to facilitate changing the timing of the clock signal based on the timing verification result.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous data transfer and processing device comprising:

at least one data transfer path including a plurality of cascaded latch circuits each entering a transparent state of passing a received signal to an output node and a latching state of holding the received signal at said output node irrespectively of a change of the signal at the signal input node in accordance with a clock control signal applied at a clock input node, two consecutive latch circuits in said plurality of latch circuits being configured such that when one is in the latching state, another is in the transparent state; and control circuitry for generating a control signal for controlling a state of each of said plurality of latch circuits and transmitting the generated control signal to each of said plurality of latch circuits as said clock control signal, said control circuitry including a plurality of clock control circuits, arranged corresponding to the respective latch circuits, for applying the control signal to the clock input node of a corresponding latch circuit in accordance with a clock signal transmitted to the corresponding latch circuit and the clock control signal at the clock input node of the latch circuit at a next stage of the corresponding latch circuit.

2. The synchronous data transfer and processing device according to claim 1, wherein each of said clock control circuits sets said control signal in a state of designating the transparent state when the clock signal to the corresponding latch circuit is active to designate the transparent state and the clock control signal at the clock input node of the latch circuit at the next stage designates the latching state.

3. The synchronous data transfer and processing device according to claim 2, wherein each of said clock control circuits sets the control signal to the corresponding latch circuit in the latching state when the clock signal to said corresponding latch circuit is inactive to designate the latching state, irrespectively of a state of the clock control signal at the clock input node of the latch circuit at the next stage.

4. The synchronous data transfer and processing device according to claim 1, wherein said at least one data transfer path includes a plurality of latch strings arranged in parallel, each of the latch strings including a plurality of the cascaded latch circuits; and said control circuitry is arranged for said plurality of latch strings in common, and each of said clock control circuits transmits said control signal to the latch circuits arranged corresponding to each other in said plurality of latch stings.

5. The synchronous data transfer and processing device according to claim 1, further comprising a logical circuit, interposed at a selected position of said plurality of latch circuits, for performing a predetermined processing on at least the signal received from the latch circuit in a preceding stage of the logical circuit for transference to the latch circuit at a next stage of the logical circuit.

6. The synchronous data transfer and processing device according to claim 5, wherein
said control circuitry further comprises a latch control circuit arranged corresponding to the latch circuit in the preceding stage of the logical circuit, for generating the control signal to said latch circuit at said preceding stage under simulation that the control signal to the latch circuit at the next stage of the logical circuit is set in the latching state.

7. The synchronous data transfer and processing device according to claim 5, wherein
said control circuitry further comprises a latch control circuit, arranged for said latch circuit in said preceding stage, for generating the control signal to said latch circuit in said preceding stage in response to a corresponding clock signal.

8. The synchronous data transfer and processing device according to claim 5, wherein
said control circuitry further comprises a latch control circuit, arranged corresponding to said latch circuit in said preceding stage of said logical circuit and receiving the clock signal transmitted to the corresponding latch circuit and a signal fixed to a state instructing that said latch circuit at said next stage is in the latching state, for generating the clock control signal to said latch circuit in the preceding stage.

9. The synchronous data transfer and processing device according to claim 1, further comprising a latch control circuit arranged corresponding to the latch circuit in a final stage of said plurality of cascaded latch circuits, receiving the clock signal transmitted to said latch circuit in said final stage and a signal fixed to a latch instructing state, and generating the control signal to said latch circuit in the final stage as said clock control signal in accordance with received signals.

10. The synchronous data transfer and processing device according to claim 1, wherein
said control circuitry further comprises a latch control circuit, arranged corresponding to the latch circuit in a final stage of said plurality of cascaded latch circuits, for generating the control signal for said latch circuit in the final stage as said clock control signal in accordance with the lock signal transmitted to said latch circuit in the final stage.

11. The synchronous data transfer and processing device according to claim 1, wherein
said plurality of cascaded latch circuits include a boundary latch circuit, arranged on a boundary of two blocks receiving the clock signals transmitted through separate paths, for transferring a signal from one of the blocks to another of the blocks.

12. The synchronous data transfer and processing device according to claim 1, wherein
said plurality of cascaded latch circuits constitute a scan path for making an internal circuit node externally observable.

13. A synchronous data transfer and processing device comprising:
at least one signal transfer path including a plurality of flip-flops, arranged in cascade, each including a first latch circuit and a second latch circuit complementarily entering a latching state and a transparent state;
a logical circuit, interposed at a selected position on the signal transfer path, for performing a predetermined processing on an applied signal; and
transfer control circuitry for controlling a signal transfer operation of each of said plurality of flip-flops,
said transfer control circuitry including;
a plurality of flip-flop control circuits, arranged corresponding to said plurality of flip-flops, each for generating a control signal to a corresponding flip-flop in accordance with a clock signal transmitted to the corresponding flip-flop and the control signal for the flip-flop in a next stage of the corresponding flip-flop, each flip-flop control circuit generating the control signal to the corresponding flip-flop in accordance with the transmitted clock signal when the control signal to said flip-flop at said next stage instructs that said flip-flop at the next stage enters the latching state, and
a logical stage control circuit, arranged corresponding to the flip-flop arranged in a preceding stage of said logical circuit, for generating the control signal to said flip-flop in the preceding stage of said logical circuit in accordance with a corresponding clock signal with simulation that the flip-flop arranged at a next stage of said logical circuit is in the latching state.

14. The synchronous data transfer and processing device according to claim 13, wherein
said logical stage control circuit generates the control signal to said flip-flop in the preceding stage of said logical circuit in accordance with the clock signal transmitted to said flip-flop in said preceding stage of said logical circuit.

15. The synchronous data transfer and processing device according to claim 13, wherein
said logical stage control circuit generates the control signal to said flip-flop in said preceding stage of said logical circuit in accordance with the clock signal transmitted to said flip-flop in said preceding stage of said logical circuit and a signal fixed to a state of instructing that the flip-flop at said next stage of said logical circuit is in the latching state.

16. The synchronous data transfer and processing device according to claim 13, wherein
said transfer control circuitry further comprises a final stage control circuit, arranged corresponding to the flip-flop in a final stage of said plurality of flip-flops, for generating the control signal to said flip-flop in the final stage in accordance with the clock signal transmitted to said flip-flop in said final stage and a signal fixed to a latch instructing state.

17. The synchronous data transfer and processing device according to claim 13, wherein
said transfer control circuitry further comprises a final stage control circuit, arranged corresponding to the flip-flop in a final stage of said plurality of flip-flops, for generating the control signal to said flip-flop in said final stage in accordance with the clock signal transmitted to said flip-flop in said final stage.

18. The synchronous data transfer and processing device according to claim 13, wherein said plurality of flip-flops include flip-flops, arranged at a clock block boundary, receiving the clock signals transmitted through separate clock distribution paths.

19. The synchronous data transfer and processing device according to claim 13, wherein
said plurality of flip-flops constitute a scan path for setting an internal node to an externally accessible state.

20. The synchronous data transfer and processing device according to claim 13, wherein said at least one signal transfer path includes a plurality of transfer paths, arranged in parallel with one another, each including a plurality of the flip-flops; and each of the flip-flop control circuits transmits the control signal to the flip-flops arranged at a corresponding position on said plurality of transfer paths in common.

* * * * *